US011127895B2

(12) United States Patent
Shirotori et al.

(10) Patent No.: US 11,127,895 B2
(45) Date of Patent: Sep. 21, 2021

(54) MAGNETIC MEMORY DEVICE

(71) Applicant: KABUSHIKI KAISHA TOSHIBA, Tokyo (JP)

(72) Inventors: Satoshi Shirotori, Yokohama Kanagawa (JP); Yuichi Ohsawa, Yokohama Kanagawa (JP); Hideyuki Sugiyama, Kawasaki Kanagawa (JP); Altansargai Buyandalai, Kawasaki Kanagawa (JP); Mariko Shimizu, Setagaya Tokyo (JP); Hiroaki Yoda, Kawasaki Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 16/684,683

(22) Filed: Nov. 15, 2019

(65) Prior Publication Data

US 2020/0161536 A1 May 21, 2020

(30) Foreign Application Priority Data

Nov. 16, 2018 (JP) .............................. JP2018-215736

(51) Int. Cl.
*H01L 43/02* (2006.01)
*H01L 43/12* (2006.01)

(52) U.S. Cl.
CPC .............. *H01L 43/02* (2013.01); *H01L 43/12* (2013.01)

(58) Field of Classification Search
CPC ................................ H01L 43/02; H01L 43/12
See application file for complete search history.

(56) References Cited

U.S. PATENT DOCUMENTS

2009/0224300 A1 9/2009 Yamagishi et al.
2011/0049657 A1* 3/2011 Tsukamoto ............ H01L 43/08
257/421

(Continued)

FOREIGN PATENT DOCUMENTS

JP          4835614 B2    12/2011
JP      2015-220465 A    12/2015

(Continued)

OTHER PUBLICATIONS

Takeuchi et al., "Spin-orbit torques in high-resistivity-W/CoFeB/MgO," Applied Physics Letters, 112:192408-1-192408-4 (2018).

*Primary Examiner* — Errol V Fernandes
(74) *Attorney, Agent, or Firm* — Finnegan, Henderson, Farabow, Garrett & Dunner L.L.P.

(57) ABSTRACT

According to one embodiment, a magnetic memory device includes a first insulating region, a first counter insulating region, a first conductive member, and a first magnetic element. The first conductive member is provided between the first insulating region and the first counter insulating region. The first conductive member extends in a first direction crossing a second direction. The second direction is from the first insulating region toward the first counter insulating region. The first magnetic element is provided between the first insulating region and the first counter insulating region. A third direction from the first conductive member toward the first magnetic element crosses a plane including the first and second directions. A portion of a first insulating side surface of the first insulating region opposes the first conductive member. A portion of a first counter insulating side surface of the first counter insulating region opposes the first conductive member.

20 Claims, 15 Drawing Sheets

(56) References Cited

U.S. PATENT DOCUMENTS

| | | | |
|---|---|---|---|
| 2014/0056060 A1 | 2/2014 | Khvalkovskiy et al. | |
| 2014/0056061 A1 | 2/2014 | Khvalkovskiy et al. | |
| 2015/0340406 A1 | 11/2015 | Jo | |
| 2015/0380478 A1* | 12/2015 | Levy | H01L 28/87 |
| | | | 257/532 |
| 2016/0064649 A1* | 3/2016 | Watanabe | H01L 43/08 |
| | | | 257/421 |
| 2017/0069685 A1 | 3/2017 | Lin | |
| 2017/0169872 A1 | 6/2017 | Yoda et al. | |
| 2018/0040357 A1 | 2/2018 | Shirotori et al. | |
| 2018/0040812 A1 | 2/2018 | Shimizu et al. | |
| 2018/0159024 A1 | 6/2018 | Buyandalai et al. | |
| 2018/0309050 A1* | 10/2018 | Torng | H01L 23/5226 |

FOREIGN PATENT DOCUMENTS

| | | |
|---|---|---|
| JP | 2017-112351 A | 6/2017 |
| JP | 6271653 B1 | 1/2018 |
| JP | 2018-22806 A | 2/2018 |
| JP | 6328391 B2 | 5/2018 |
| JP | 2018-93069 A | 6/2018 |

* cited by examiner

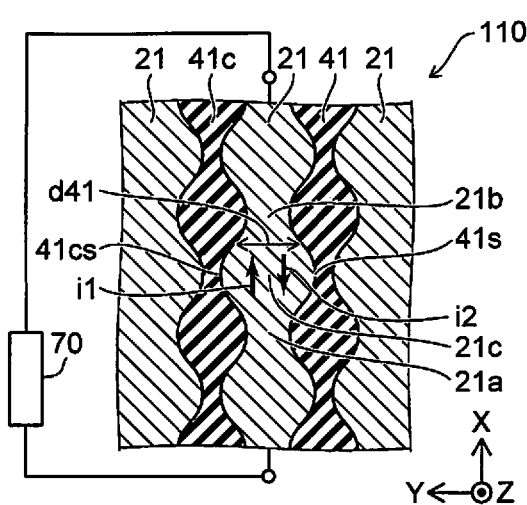
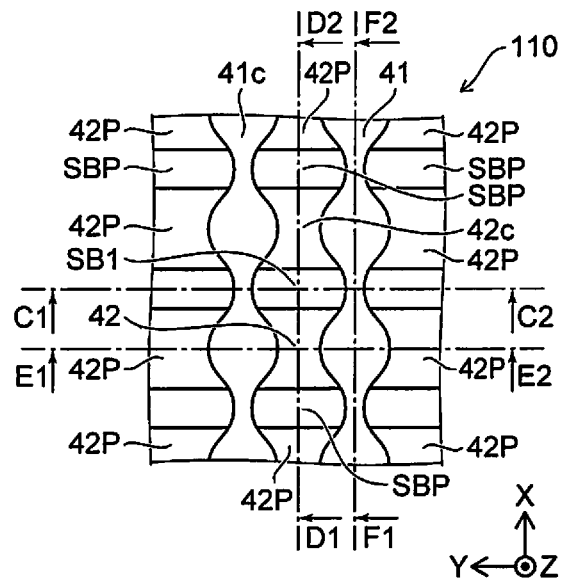
FIG. 1A  FIG. 1B
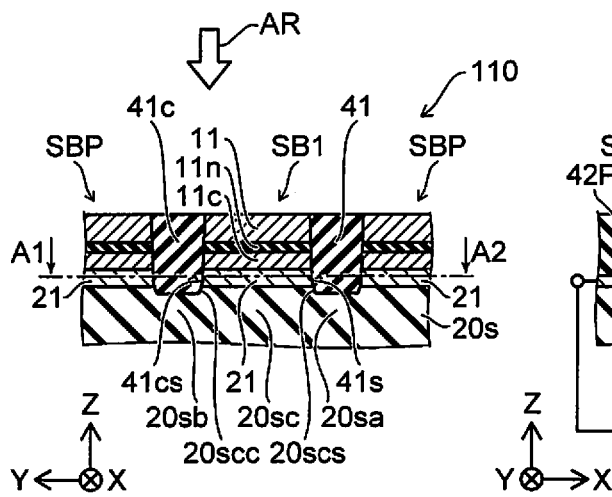
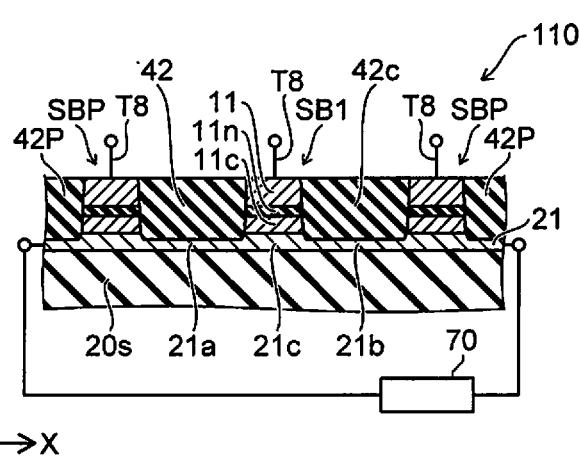
FIG. 1C  FIG. 1D
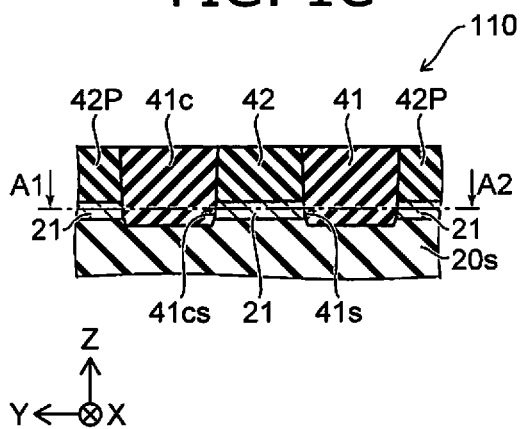
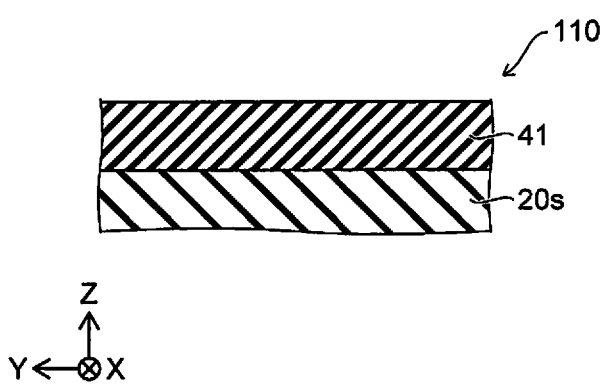
FIG. 1E  FIG. 1F

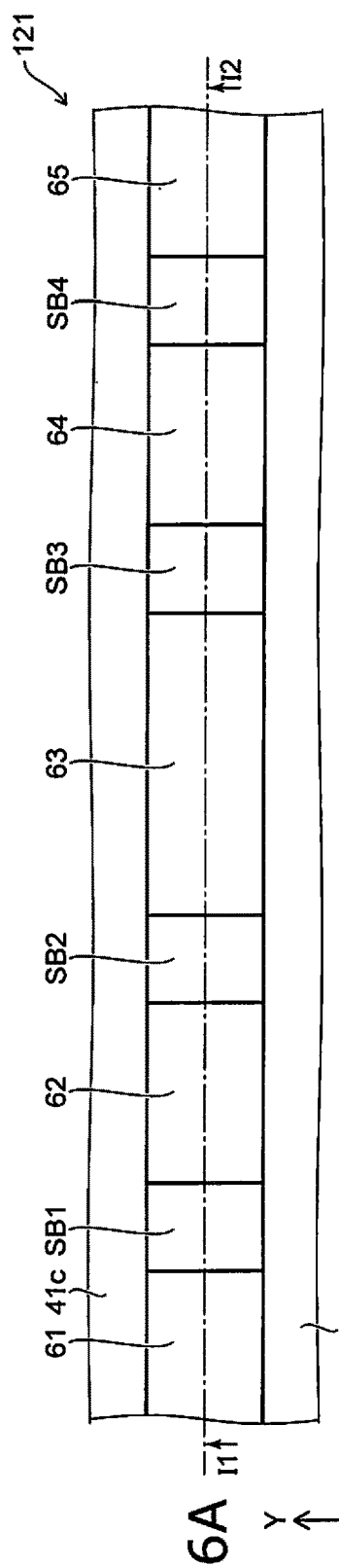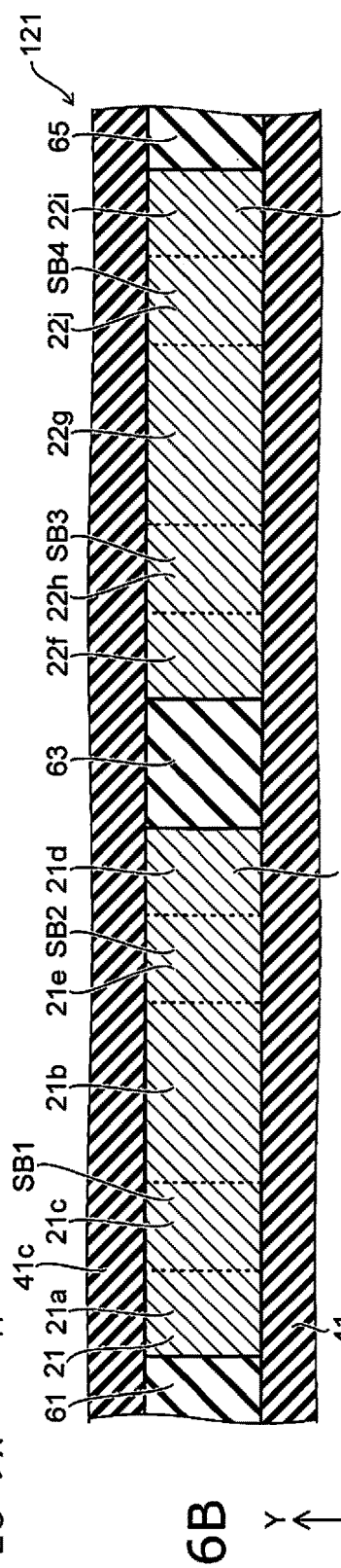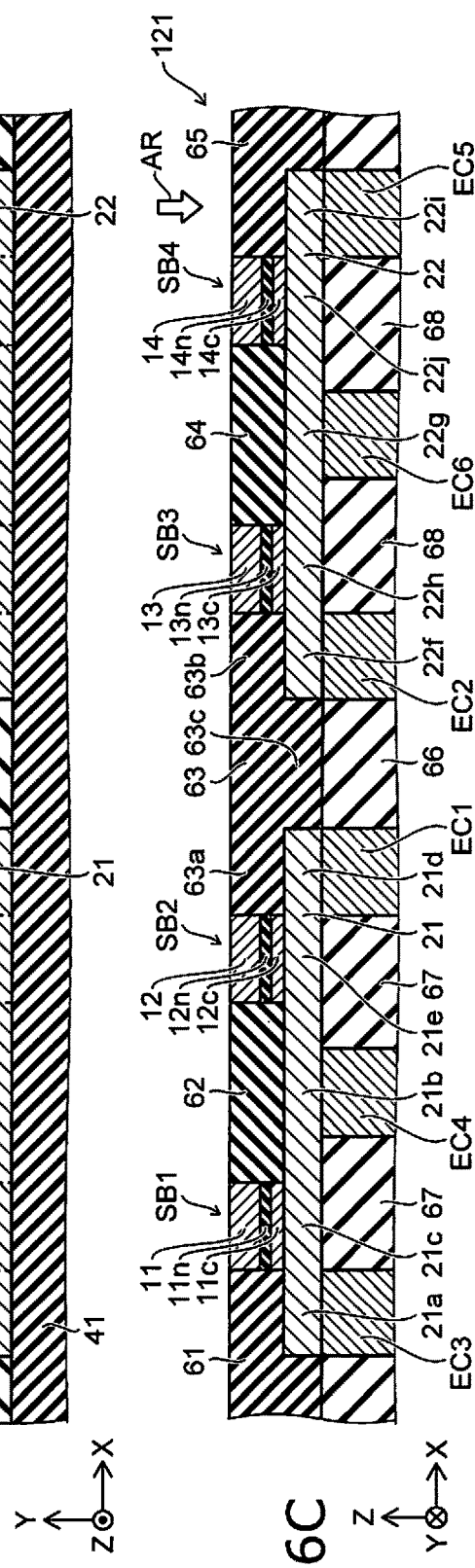

MAGNETIC MEMORY DEVICE

CROSS-REFERENCE TO RELATED APPLICATIONS

This application is based upon and claims the benefit of priority from Japanese Patent Application No. 2018-215736, filed on Nov. 16, 2018; the entire contents of which are incorporated herein by reference.

FIELD

Embodiments described herein relate generally to a magnetic memory device.

BACKGROUND

It is desirable to increase the storage density of a magnetic memory device.

BRIEF DESCRIPTION OF THE DRAWINGS

FIG. 1A to FIG. 1F are schematic views illustrating a magnetic memory device according to a first embodiment;
FIG. 9A and FIG. 96 are schematic views illustrating a magnetic memory device according to the first embodiment;
FIG. 16A to FIG. 16C are schematic views illustrating a magnetic memory device according to the second embodiment.

DETAILED DESCRIPTION

Figure 2A:
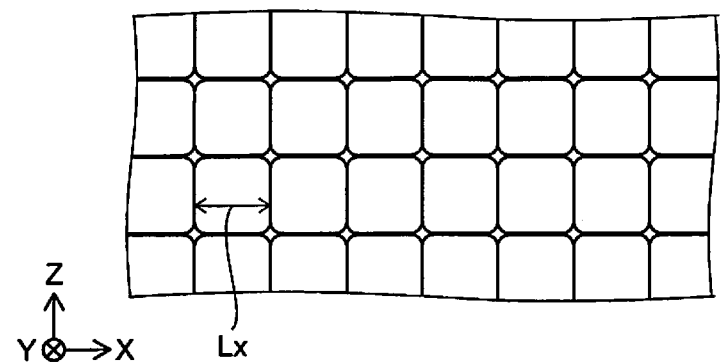
FIG. 2A and FIG. 2B are schematic views illustrating a portion of the magnetic memory device according to the first embodiment.

According to one embodiment, a magnetic memory device includes a first insulating portion, a second insulating portion, a third insulating portion, a first conductive member, a first magnetic element, and a second magnetic element. The second insulating portion is between the first insulating portion and the third insulating portion in a first direction. The first direction is from the first insulating portion toward the third insulating portion. The first conductive member is provided between at least a portion of the first insulating portion and at least a portion of the third insulating portion. The first magnetic element is provided between the first insulating portion and the second insulating portion. A direction from the first conductive member toward the first magnetic element is aligned with a third direction crossing the first direction. The second magnetic element is provided between the second insulating portion and the third insulating portion. A direction from the first conductive member toward the second magnetic element is aligned with the third direction. A material of the first insulating portion is different from a material of the second insulating portion.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1A to FIG. 1F are schematic views illustrating a magnetic memory device according to a first embodiment.

FIG. 1A is a line A1-A2 cross-sectional view of FIG. 1C and FIG. 1E. FIG. 1B is a plan view as viewed along arrow AR of FIG. 1C. FIG. 1C is a line C1-C2 cross-sectional view of FIG. 1B. FIG. 1D is a line D1-D2 cross-sectional view of FIG. 1B. FIG. 1E is a line E1-E2 cross-sectional view of FIG. 1B. FIG. 1F is a line F1-F2 cross-sectional view of FIG. 1B.

As shown in these drawings, the magnetic memory device 110 according to the embodiment includes a first insulating region 41, a first counter insulating region 41c, a first conductive member 21, and a first magnetic element SB1. As shown in FIG. 1A, the magnetic memory device 110 may further include a controller 70.

As shown in FIG. 1A, the first conductive member 21 is provided between the first insulating region 41 and the first counter insulating region 41c. The first conductive member 21 extends in a first direction.

In the example, the first direction is an X-axis direction. One direction perpendicular to the X-axis direction is taken as a Y-axis direction. A direction perpendicular to the X-axis direction and the Y-axis direction is taken as a Z-axis direction.

The direction from the first insulating region 41 toward the first counter insulating region 41c is a second direction. The first direction crosses the second direction. The second direction is, for example, the Y-axis direction.

As shown in FIG. 1C, the first magnetic element SB1 is provided between the first insulating region 41 and the first counter insulating region 41c. The direction from the first conductive member 21 toward the first magnetic element SB1 is taken as a third direction. The third direction crosses a plane including the first direction and the second direction. The third direction is, for example, the Z-axis direction.

As shown in FIG. 1A and FIG. 1D, the first conductive member 21 includes a first portion 21a, a second portion 21b, and a third portion 21c. The third portion 21c is between the first portion 21a and the second portion 21b in the first direction (the X-axis direction). The direction from the first portion 21a toward the second portion 21b is aligned with the first direction (the X-axis direction).

As shown in FIG. 1C and FIG. 1D, the first magnetic element SB1 includes a first magnetic layer 11, a first counter magnetic layer 11c, and a first nonmagnetic layer 11n. The first counter magnetic layer 11c is provided between the first conductive member 21 (the third portion 21c) and the first magnetic layer 11 in the third direction (e.g., the Z-axis direction). The first nonmagnetic layer 11n is provided between the first magnetic layer 11 and the first counter magnetic layer 11c in the third direction.

As shown in FIG. 1A and FIG. 1D, for example, the controller 70 is electrically connected to the first portion 21a of the first conductive member 21 and the second portion 21b of the first conductive member 21. For example, the controller 70 supplies a first current i1 or a second current i2 to the first conductive member 21. The first current i1 has an orientation from the first portion 21a toward the second portion 21b. The second current i2 has an orientation from the second portion 21b toward the first portion 21a. The electrical resistance of the first magnetic element SB1 is changed by these currents.

For example, a first electrical resistance of the first magnetic element SB1 when the first current i1 flows is different from a second electrical resistance of the first magnetic element SB1 when the second current i2 flows.

For example, the orientation of the magnetization of the first magnetic layer 11 is substantially fixed. On the other hand, the orientation of the magnetization of the first counter magnetic layer 11c changes easily compared to the orientation of the magnetization of the first magnetic layer 11. The first magnetic layer 11 is, for example, a reference layer. The first counter magnetic layer 11c is, for example, a free magnetic layer.

For example, a spin Hall effect is generated in the first counter magnetic layer 11c by the first current i1 or the second current i2. Thereby, for example, when the first current i1 flows, the orientation of the magnetization of the first counter magnetic layer 11c has an orientation corresponding to the first current i1. On the other hand, when the second current i2 flows, the orientation of the magnetization of the first counter magnetic layer 11c has an orientation corresponding to the second current i2. These orientations of the magnetization are different from each other. For example, the angle between the magnetization of the first counter magnetic layer 11c and the magnetization of the first magnetic layer 11 when the first current i1 flows is different from the angle between the magnetization of the first counter magnetic layer 11c and the magnetization of the first magnetic layer 11 when the second current i2 flows. The electrical resistance changes due to this angle difference. For example, this is based on a magnetoresistance effect.

The different electrical resistance states correspond to different memory states of the first magnetic element SB1. One of the different memory states is, for example, one of "1" or "0." Another one of the different memory states is, for example, the other of "1" or "0."

As shown in FIG. 1D, a terminal T8 may be provided at the first magnetic element SB1. The terminal T8 is electrically connected to the first magnetic layer 11 of the first magnetic element SB1. The controller 70 is electrically connected to the terminal T8. The interconnect for the connection is not illustrated for easier viewing of the drawing. A switch, etc., may be provided in the interconnect. A characteristic (an electrical resistance, a current, or a voltage) which relates to the electrical resistance of the first magnetic element SB1 may be detected by the controller 70 via the terminal T8.

As shown in FIG. 1D, multiple magnetic elements such as that recited above are provided. One of multiple magnetic elements SBP corresponds to the first magnetic element SB1. For example, the multiple magnetic elements SBP are arranged in a matrix configuration along the X-axis direction and the Y-axis direction.

As shown in FIG. 1D, the terminal T8 may be provided at each of the multiple magnetic elements SBP. A characteristic which relates to the electrical resistance may be detected by the controller 70 via the terminal T8 for the multiple magnetic elements SBP. The potential (the potential of the first magnetic layer 11) may be controlled by the controller 70 via the terminal T8 for each of the multiple magnetic elements SBP. For example, the multiple magnetic elements SBP may be set to a selected state or an unselected state.

As shown in FIG. 1B and FIG. 1D, the multiple magnetic elements SBP may be provided at one first conductive member 21. Multiple conductive members (first conductive members 21) may be provided. The multiple conductive members are arranged along the X-axis direction. As described below, the number of the multiple magnetic elements SBP provided at one first conductive member 21 may be two. One magnetic element SBP may be provided at one first conductive member 21.

Thus, in the embodiment, a storage operation (a write operation) is performed by causing a current to flow in the first conductive member 21. For example, the current (the first current i1 and the second current i2) may flow not only in the first conductive member 21 but also partially in the first counter magnetic layer 11c. In such a case, the resistance of the current path including the first conductive member 21 is different between the portion overlapping the first counter magnetic layer 11c and the portion (the inter-element region) not overlapping the first counter magnetic layer 11c.

On the other hand, as shown in FIG. 1D, when patterning a stacked film used to form the magnetic elements SBP, there are cases where the thicknesses of the portions of the first conductive member 21 not overlapping the magnetic elements SBP become thin. In such a case as well, the resistance is different between the portion of the first conductive member 21 overlapping the first magnetic element SB1 and the portions (the inter-element regions) of the first conductive member 21 not overlapping the first magnetic element SB1.

The temperature of the first conductive member 21 increases when the current flows in the first conductive member 21. As recited above, the resistance is nonuniform and is different by location in the first conductive member 21. In such a case, the temperature increases excessively locally according to the location in the first conductive member 21. There are cases where the first conductive member 21 is damaged by the local temperature increase. There are also cases where the resistance increases locally due to, for example, migration of a metallic element included in the first conductive member 21. When the first conductive member 21 expands locally, for example, there are also cases where a strong stress is generated by the insulating portions (e.g., the first insulating region 41, the first counter insulating region 41c, etc.) provided around the first conductive member 21; and local cracks, etc., occur in the first conductive member 21.

On the other hand, local stress is applied to the insulating portions (e.g., the first insulating region 41, the first counter insulating region 41c, etc.) provided around the first conductive member 21 due to the local temperature increase of the first conductive member 21. There are also cases where a portion of the insulating portions is damaged by the local stress. For example, there is a possibility that the characteristics may become unstable.

In the embodiment as shown in FIG. 1A, a portion of a first insulating side surface 41s of the first insulating region 41 opposing the first conductive member 21 is oblique to the first direction (the X-axis direction). A portion of a first counter insulating side surface 41cs of the first counter insulating region 41c opposing the first conductive member 21 is oblique to the first direction (the X-axis direction).

By setting a portion of the first insulating side surface 41s to be oblique to the extension direction (the X-axis direction) of the first conductive member 21, the stress that is generated when the local temperature increase, expansion, etc., occur in the first conductive member 21 can be dispersed. The damage of the first conductive member 21 can be suppressed thereby. For example, the life of the first conductive member 21 increases. For example, the damage of the first insulating region 41 and the first counter insulating region 41c can be suppressed. The operations are stabilized. For example, stable operations can be maintained even when the element size is reduced. As a result, for example, the storage density can be increased. According to the embodiment, a magnetic memory device can be provided in which the storage density can be increased.

As shown in FIG. 1B and FIG. 1D, multiple first magnetic elements SB1 may be provided (e.g., the multiple magnetic elements SBP). As shown in FIG. 1A, the distance along the second direction (e.g., the Y-axis direction) between the first insulating side surface 41s and the first counter insulating side surface 41cs is taken as a distance d41. The distance d41 may repeat an increase and decrease corresponding to the multiple first magnetic elements SB1 (the multiple magnetic elements SBP).

For example, when the multiple first magnetic elements SB1 (the multiple magnetic elements SBP) are provided, the local temperature increase and the local expansion that occur in the first conductive member 21 correspond to the multiple first magnetic elements SB1. By repeating the increase and decrease of the distance d41, the effects due to the generated local temperature increase and local expansion corresponding to the multiple first magnetic elements SB1 can be suppressed.

In the example shown in FIG. 1A, the distance d41 at the positions corresponding to the multiple first magnetic elements SB1 (the multiple magnetic elements SBP) is longer than the distance d41 at the positions corresponding to the regions between the multiple first magnetic elements SB1 (the multiple magnetic elements SBP).

As shown in FIG. 1B, the multiple magnetic elements SBP are arranged in the X-axis direction and the Y-axis direction. The first insulating region 41, the first counter insulating region 41c, and an insulating region 42P are provided around the multiple magnetic elements SBP. For example, the magnetic memory device 110 may further include a second insulating region 42 and a second counter insulating region 42c. One of the multiple insulating regions 42P corresponds to the second insulating region 42. Another one of the multiple insulating regions 42P corresponds to the second counter insulating region 42c. The second insulating region 42 and the second counter insulating region 42c are between the first insulating region 41 and the first counter insulating region 41c in the second direction (e.g., the Y-axis direction).

As described above, the first conductive member 21 includes the first portion 21a, the second portion 21b, and the third portion 21c. As shown in FIG. 1D, the direction from the first portion 21a toward the second insulating region 42 is aligned with the third direction (e.g., the Z-axis direction). The direction from the second portion 21b toward the second counter insulating region 42c is aligned with the third direction. As described above, the direction from the third portion 21c toward the first magnetic element SB1 is aligned with the third direction.

As shown in FIG. 1B, the first magnetic element SB1 is between the first insulating region 41 and the first counter insulating region 41c in the X-axis direction. The first magnetic element SB1 is between the second insulating region 42 and the second counter insulating region 42c in the Y-axis direction.

As shown in FIG. 1A and FIG. 1C, the first conductive member 21 is between the first insulating region 41 and the first counter insulating region 41c in the Y-axis direction. As shown in FIG. 1D, the second insulating region 42 and the second counter insulating region 42c are provided on portions of the first conductive member 21.

The characteristics of the first conductive member 21 may be affected by the first insulating region 41, the first counter insulating region 41c, the second insulating region 42, and the second counter insulating region 42c. For example, stress may be applied to the first conductive member 21 from at least a portion of these insulating regions. For example, the stress of the first conductive member 21 may be relaxed by at least a portion of these insulating regions.

In one example according to the embodiment, the material of the first insulating region 41 may be different from the material of the second insulating region 42. The material of the first insulating region 41 may be different from the material of the second counter insulating region 42c. For example, the material of the first insulating region 41 may be substantially the same as the material of the first counter insulating region 41c. For example, the material of the second insulating region 42 may be substantially the same as the material of the second counter insulating region 42c.

The characteristics (e.g., the conductivity, etc.) of the first conductive member 21 may be provided with anisotropy by the effects of these insulating regions. For example, if the first conductive member 21 is a crystal, the lattice length may be provided with anisotropy by the effects of these insulating regions. An example of the lattice length will now be described.

Figure 2B:
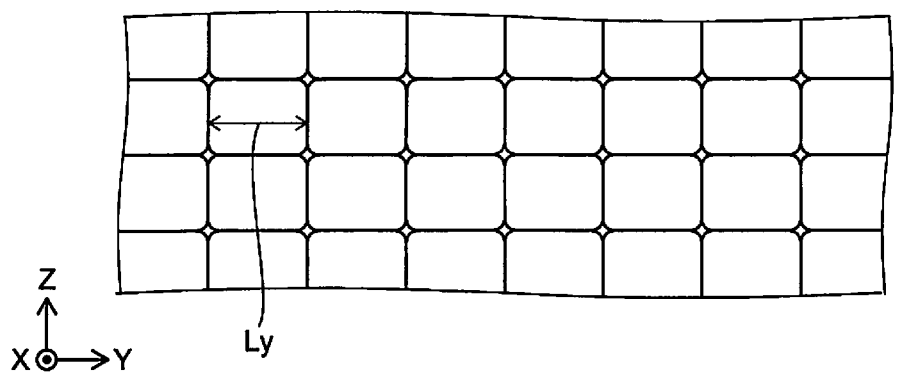

FIG. 2A and FIG. 2B are schematic views illustrating a portion of the magnetic memory device according to the first embodiment.

These drawings illustrate lattice lengths of the first conductive member 21. FIG. 2A illustrates the lattice length in the X-Z plane. FIG. 2B illustrates the lattice length in the Y-Z plane. For example, as shown in FIG. 2A, the lattice length along the first direction (the X-axis direction) of the first conductive member 21 is taken as a first lattice length Lx. As shown in FIG. 2B, the lattice length along the second direction (e.g., the Y-axis direction) of the first conductive member 21 is taken as a second lattice length Ly. In one example of the embodiment, the first lattice length Lx is different from the second lattice length Ly. For example, the second lattice length Ly is larger than the first lattice length Lx. For example, the absolute value of the difference between the second lattice length Ly and the first lattice length Lx may be not less than 0.1% of the first lattice length Lx.

For example, when anisotropy is generated in the lattice length, anisotropy is generated in the characteristics (e.g., the conductivity, etc.) of the first conductive member 21. For example, the uniformity of the orientation of the current flowing through the first conductive member 21 increases. For example, the uniformity of the effect (e.g., the spin Hall effect) applied from the first conductive member 21 to the first counter magnetic layer 11c increases. More stable operations are obtained.

In the embodiment, anisotropy of the lattice length may be generated in the first counter magnetic layer 11c. For example, the lattice length along the second direction (the Y-axis direction) of the first counter magnetic layer 11c may be larger than the lattice length along the first direction (e.g., the X-axis direction) of the first counter magnetic layer 11c. Anisotropy of the lattice length may be generated in the first nonmagnetic layer 11n. For example, the lattice length along the second direction (the Y-axis direction) of the first nonmagnetic layer 11n may be larger than the lattice length along the first direction (e.g., the X-axis direction) of the first nonmagnetic layer 11n. By setting the lattice length of the first counter magnetic layer 11c to have anisotropy such as that recited above, the anisotropy of the lattice length of the first conductive member 21 is stabilized easily.

The first lattice length Lx (referring to FIG. 2A) may correspond to the lattice length in the X-axis direction of the first counter magnetic layer 11c or the first nonmagnetic layer 11n. The second lattice length Ly (referring to FIG. 2B) may correspond to the lattice length in the Y-axis direction of the first counter magnetic layer 11c or the first nonmagnetic layer 11n.

For example, the information that relates to the lattice length is obtained from a TEM image, etc. For example, the information that relates to the size relationship of the lattice length can be obtained from the results of a Fourier transform of the lattice image obtained from the TEM image. For example, the Fourier transform is performed for the crystal plane (i.e., the lattice plane).

In one example of the magnetic memory device 110, the first insulating region 41 and the first counter insulating region 41c may be formed by SOG (Spin On Glass). In SOG, the insulating portion can be formed by coating an organic material including silicon and by heating, etc. For example, the organic material which includes silicon includes methylsiloxane. In another example, the first insulating region 41 and the first counter insulating region 41c may include, for example, a resin (e.g., polyimide, etc.). On the other hand, an insulating portion of silicon oxide can be formed by CVD (chemical vapor deposition), etc.

For example, it was found that a good storage operation is obtained when the first insulating region 41 and the first counter insulating region 41c are formed by SOG or the like and the second insulating region 42 and the second counter insulating region 42c are formed by CVD. It is considered that this is caused by the relaxation of the stress of the first conductive member 21 by such a material difference.

For example, it is considered that a first material obtained by SOG deforms easily compared to a second material obtained by CVD. For example, the first material may be porous. For example, many unbonded groups may be included in the atoms (e.g., silicon) included in the first material. The first material is softer than the second material due to such characteristics.

The first material may include, for example, a silanol group. The first material may include, for example, a hydroxide group. The first material may include, for example, a hydrocarbon group.

For example, at least one of the first insulating region 41 or the first counter insulating region 41c may have at least one of a first concentration higher than the concentration of the silanol group included in the second insulating region 42, a second concentration higher than the concentration of the hydroxide group included in the second insulating region 42, a third concentration higher than the concentration of the hydrocarbon group included in the second insulating region 42, a fourth concentration higher than the concentration of the imide group included in the second insulating region 42, a first porosity higher than the porosity of the second insulating region 42, or a first density lower than the density of the second insulating region 42.

For example, the information that relates to these chemical groups is obtained by infrared spectroscopy, etc. The information that relates to the porosity practically may be obtained by the microscopy of a cross section, etc.

The stress that is generated locally in the first conductive member 21 is relaxed easily when the material of the first insulating region 41 is different from the material of the second insulating region 42. Therefore, the first insulating side surface 41s and the first counter insulating side surface 41cs may be substantially parallel to the first direction (the X-axis direction). For example, the distance d41 (referring to FIG. 1A) may be constant. In such a case as well, the stress is relaxed by the material difference.

In other words, in one example, the magnetic memory device 110 may include the first conductive member 21, the first insulating region 41, the first magnetic element SB1, and the second insulating region 42. The first conductive member 21 includes the first portion 21a, the second portion 21b, and the third portion 21c between the first portion 21a and the second portion 21b. The first conductive member 21 extends along the first direction (e.g., the X-axis direction) which is from the first portion 21a toward the second portion 21b. The second direction (e.g., the Y-axis direction) from the first insulating region 41 toward the first conductive member 21 crosses the first direction. The third direction (the Z-axis direction) from the third portion 21c toward the first magnetic element SB1 crosses the plane including the first direction and the second direction. The direction from the first portion 21a toward the second insulating region 42 is aligned with the third direction (e.g., the Z-axis direction). The direction from the second insulating region 42 toward the first magnetic element SB1 is aligned with the first direction (the X-axis direction) (referring to FIG. 1D). The first insulating region 41 may have at least one of the first concentration higher than the concentration of the silanol group included in the second insulating region 42, the second concentration higher than the concentration of the hydroxide group included in the second insulating region 42, the third concentration higher than the concentration of the hydrocarbon group included in the second insulating region 42, the fourth concentration higher than the concentration of the imide group included in the second insulating region 42, the first porosity higher than the porosity of the second insulating region 42, or the first density lower than the density of the second insulating region 42. Thereby, for example, the stress of at least a portion of the first conductive member 21 and the first insulating region 41 is relaxed. For example, stable operations can be maintained even when the element size is reduced. As a result, for example, the storage density can be increased. According to the embodiment, a magnetic memory device can be provided in which the storage density can be increased.

As shown in FIG. 1C to FIG. 1F, a first member 20s may be further provided. The first member 20s may be, for example, a substrate (or a base material). For example, the first conductive member 21 and the insulating regions are provided on the first member 20s. In one example, the first member 20s includes an insulating material (e.g., aluminum oxide, etc.). In another example, the first member 20s may include a silicon layer. The silicon layer may include a switching element such as a transistor, etc. The silicon layer may include, for example, at least a portion of the controller 70.

As shown in FIG. 1C, the first member 20s may include a first member region 20sa, a second member region 20sb, and a third member region 20sc. The third member region 20sc is between the first member region 20sa and the second member region 20sb in the second direction (e.g., the Y-axis direction). The direction from the first member region 20sa toward the second member region 20sb is aligned with the second direction.

As shown in FIG. 1C, the direction from the first member region 20sa toward the first insulating region 41 is aligned with the third direction (e.g., the Z-axis direction). The direction from the third member region 20sc toward the first magnetic element SB1 is aligned with the third direction. The direction from the second member region 20sb toward the first counter insulating region 41c is aligned with the third direction (e.g., the Z-axis direction).

As shown in FIG. 1C, a portion of the first member 20s may be recessed in a region not overlapping the first conductive member 21. The region of the first member 20s overlapping the first conductive member 21 is a protrusion; and the region of the first member 20s not overlapping the first conductive member 21 is a recess. The first insulating region 41 may be provided at the recessed region (the recess) of the first member 20s. For example, the first insulating region 41 opposes the side surface of the region (the protrusion) of the first member 20s overlapping the first conductive member 21.

In other words, the third member region 20sc of the first member 20s has a side surface 20scs crossing the second direction (e.g., the Y-axis direction). The first insulating region 41 opposes at least a portion of the side surface 20scs in the second direction (e.g., the Y-axis direction). For example, the third member region 20sc may further have another side surface 20scc crossing the second direction (e.g., the Y-axis direction). The first counter insulating region 41c opposes at least a portion of the side surface 20scc in the second direction.

In such a case, the protrusion (the third member region 20sc) of the first member 20s is provided in addition to the first conductive member 21 between the first insulating region 41 and the first counter insulating region 41c (referring to FIG. 1C). Therefore, compared to the case where the first conductive member 21 is provided but the protrusion of the first member 20s is not provided between the first insulating region 41 and the first counter insulating region 41c, the local stress that is generated in the first conductive member 21 is relaxed easily. Thereby, for example, stable operations are maintained easily even when the element size is reduced. A magnetic memory device can be provided in which the storage density can be increased.

In such a case, if the insulating portion provided at the side surface (e.g., the side surface 20scs, etc.) of the protrusion of the first member 20s is soft and the stress is relaxed easily, the effects of the local temperature increase and the local expansion of the first member 20s are relaxed more easily. The effects of the local temperature increase and the local expansion are relaxed more easily by at least one of the first insulating region 41 or the first counter insulating region 41c having at least one of the first to fourth concentrations, the first porosity, or the first density recited above.

As recited above, the local stress that is generated in the first conductive member 21 is relaxed easily in a configuration in which the first insulating region 41 opposes at least a portion of the side surface 20scs in the second direction, and the first counter insulating region 41c opposes at least a portion of the side surface 20scc in the second direction (referring to FIG. 1C). Therefore, the first insulating side surface 41s and the first counter insulating side surface 41cs may be substantially parallel to the first direction (the X-axis direction). For example, the distance d41 (referring to FIG. 1A) may be constant. In such a case as well, the stress is relaxed by the configuration recited above.

In other words, for example, the magnetic memory device 110 includes the first conductive member 21, the first insulating region 41, the first magnetic element SB1, and the first member 20s. The first conductive member 21 includes the first portion 21a, the second portion 21b, and the third portion 21c between the first portion 21a and the second portion 21b. The first conductive member 21 extends along the first direction (e.g., the X-axis direction) which is from the first portion 21a toward the second portion 21b. The second direction (e.g., the Y-axis direction) from the first insulating region 41 toward the first conductive member 21 crosses the first direction. The third direction (e.g., the Z-axis direction) from the third portion 21c toward the first magnetic element SB1 crosses a plane including the first direction and the second direction. The first member 20s includes the first member region 20sa, the second member region 20sb, and the third member region 20sc between the first member region 20sa and the second member region 20sb. The direction from the first member region 20sa toward the second member region 20sb is aligned with the second direction (e.g., the Y-axis direction). The direction from the first member region 20sa toward the first insulating region 41 is aligned with the third direction. The direction from the third member region 20sc toward the first magnetic element SB1 is aligned with the third direction. The third member region 20sc has the side surface 20scs crossing the second direction (the Y-axis direction). The first insulating region 41 opposes at least a portion of the side surface 20scs in the second direction (the Y-axis direction) (referring to FIG. 1C). By such a configuration, for example, the local stress generated in the first conductive member 21 is relaxed easily. Thereby, for example, stable operations are maintained easily even when the element size is reduced. A magnetic memory device can be provided in which the storage density can be increased.

In the embodiment as described below, the uneven configuration of the side surface of the first insulating region 41 may be different from the uneven configuration of the side surface of the second insulating region 42.

Figure 3A:
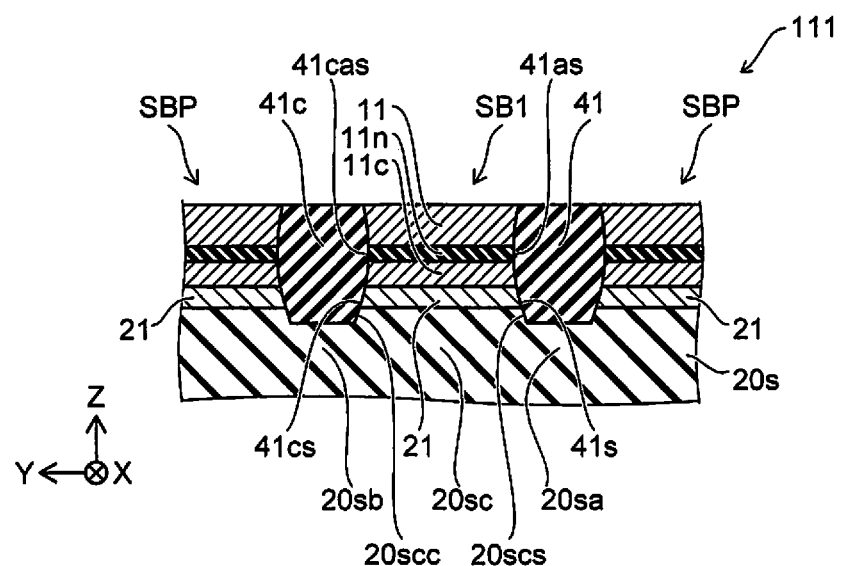
FIG. 3A and FIG. 3B are schematic views illustrating a portion of a magnetic memory device according to the first embodiment.
Figure 3B:
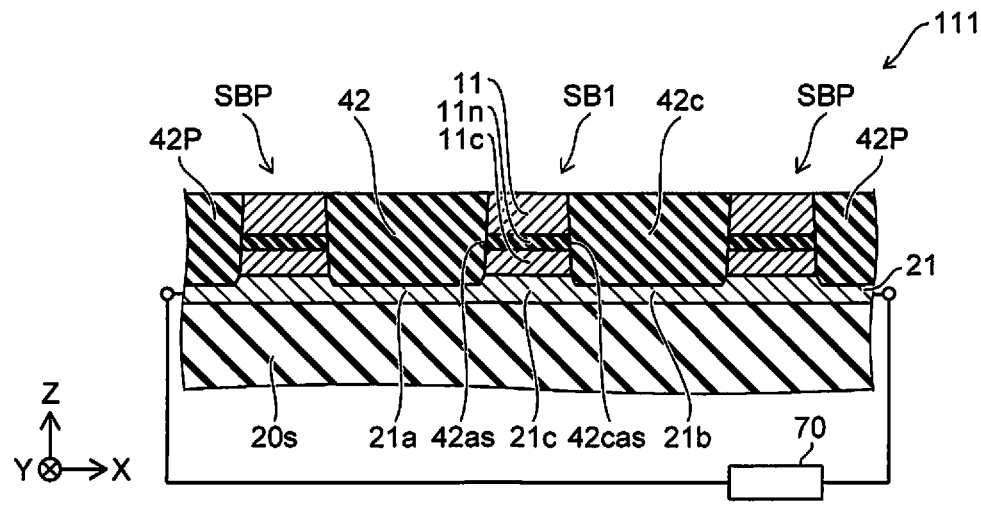

FIG. 3A and FIG. 3B are schematic views illustrating a portion of a magnetic memory device according to the first embodiment.

FIG. 3A is a cross-sectional view corresponding to FIG. 1C. FIG. 3B is a cross-sectional view corresponding to FIG. 1D. The configurations of the side surfaces of the insulating regions of the magnetic memory device 111 illustrated in these drawings are different from those of the magnetic memory device 110. Otherwise, the configuration of the magnetic memory device 111 may be the same as that of the magnetic memory device 110. An example of the configurations of the side surfaces of the insulating regions of the magnetic memory device 111 will now be described.

As shown in FIG. 3A, the first insulating region 41 has a first side surface 41as. The first side surface 41as opposes the first magnetic element SB1 in the second direction (e.g., the Y-axis direction). On the other hand, the first counter insulating region 41c has a side surface 41cas. The side surface 41cas opposes the first magnetic element SB1 in the second direction (e.g., the Y-axis direction).

As shown in FIG. 3B, the second insulating region 42 has a second side surface 42as. The second side surface 42as opposes the first magnetic element SB1 in the first direction (the X-axis direction). The second counter insulating region 42c has a side surface 42cas. The side surface 42cas opposes the first magnetic element SB1 in the first direction (the X-axis direction).

As shown in FIG. 3A, the first side surface 41as is convex toward the first magnetic element SB1 in a first cross section (the Y-Z plane) including the second direction and the third direction. For example, the first side surface 41as is greatly curved in the first cross section. For example, the portion of the first side surface 41as opposing the central portion of the first magnetic element SB1 protrudes. For example, the portion of the first side surface 41as opposing the first nonmagnetic layer 11n protrudes.

On the other hand, as shown in FIG. 3B, the first side surface 41as has a substantially linear configuration in a second cross section (the X-Z plane) including the first direction and the third direction.

For example, the curvature of the first side surface 41as in the first cross section is higher than the curvature of the second side surface 42as in the second cross section. For example, the curvature radius of the first side surface 41as in the first cross section is smaller than the curvature radius of the second side surface 42as in the second cross section.

Similarly, for example, the curvature of the side surface 41cas in the first cross section is higher than the curvature of the side surface 42cas in the second cross section. For example, the curvature radius of the side surface 41cas in the first cross section is smaller than the curvature radius of the side surface 42cas in the second cross section.

Thus, the curvature of the side surface may be different between the first insulating region 41 and the second insulating region 42. For example, as described above, the first insulating region 41 opposes the first conductive member 21 over the entire thickness direction of the first conductive member 21 (referring to FIG. 3A). On the other hand, the second insulating region 42 opposes a thickness-direction portion of the first conductive member 21. Or, there are also cases where the second insulating region 42 does not oppose the first conductive member 21. Thus, the state of opposing the first conductive member 21 is different between the first insulating region 41 and the second insulating region 42. When the first side surface 41as of the first insulating region 41 is convex, two regions of the first side surface 41as are obtained in which the oblique directions referenced to the Z-axis direction are different. In FIG. 3A, for example, the two regions are the upper portion and the lower portion of the first side surface 41as. The oblique direction of the upper portion is the reverse of the oblique direction of the lower portion.

By providing such an obliqueness in the first side surface 41as of the first insulating region 41 opposing the first conductive member 21 over the entire thickness direction of the first conductive member 21, for example, the stress that is generated locally when the local temperature increase or the local expansion occurs in the first conductive member 21 can be dispersed and relaxed.

On the other hand, by setting the second side surface 42as of the second insulating region 42 to be relatively flat, for example, the stress that is caused by the expansion of the first magnetic element SB1, etc., can be relaxed.

For example, such a side surface configuration can be controlled by controlling the patterning conditions of the stacked film including the first magnetic element SB1 and the first conductive member 21. For example, a convex configuration such as that recited above is obtained by using conditions when patterning the stacked film along the X-axis direction such that the etching rate is faster at the central portion in the thickness direction of the first magnetic element SB1.

Thus, the local stress is relaxed easily by setting the curvature of the side surface to be different between the first insulating region 41 and the second insulating region 42. Therefore, the first insulating side surface 41s and the first counter insulating side surface 41cs may be substantially parallel to the first direction (the X-axis direction). For example, the distance d41 (referring to FIG. 1A) may be constant. In such a case as well, the stress is relaxed by the side surface curvature difference.

In other words, for example, the magnetic memory device 110 includes the first conductive member 21, the first insulating region 41, the first magnetic element SB1, and the second insulating region 42. The first conductive member 21 includes the first portion 21a, the second portion 21b, and the third portion 21c between the first portion 21a and the second portion 21b. The first conductive member 21 extends along the first direction (the X-axis direction) which is from the first portion 21a toward the second portion 21b. The second direction (e.g., the Y-axis direction) from the first insulating region 41 toward the first conductive member 21 crosses the first direction. The third direction (e.g., the Z-axis direction) from the third portion 21c toward the first magnetic element SB1 crosses a plane including the first direction and the second direction. The direction from the first portion 21a toward the second insulating region 42 is aligned with the third direction (the Z-axis direction). The direction from the second insulating region 42 toward the first magnetic element SB1 is aligned with the first direction (the X-axis direction). The first insulating region 41 has the first side surface 41as opposing the first magnetic element SB1 in the second direction. The second insulating region 42 has the second side surface 42as opposing the first magnetic element SB1 in the first direction. The first side surface 41as is convex toward the first magnetic element SB1 in the first cross section including the second direction and the third direction. The curvature of the first side surface 41as in the first cross section is higher than the curvature of the second side surface 42as in the second cross section including the first direction and the third direction (referring to FIG. 3A and FIG. 3B). For example, the local stress generated in the first conductive member 21 is relaxed easily. Thereby, for example, stable operations are maintained easily even when the element size is reduced. A magnetic memory device can be provided in which the storage density can be increased.

FIG. 4A to FIG. 4F are schematic views illustrating a magnetic memory device according to the first embodiment.

Figure 4A:
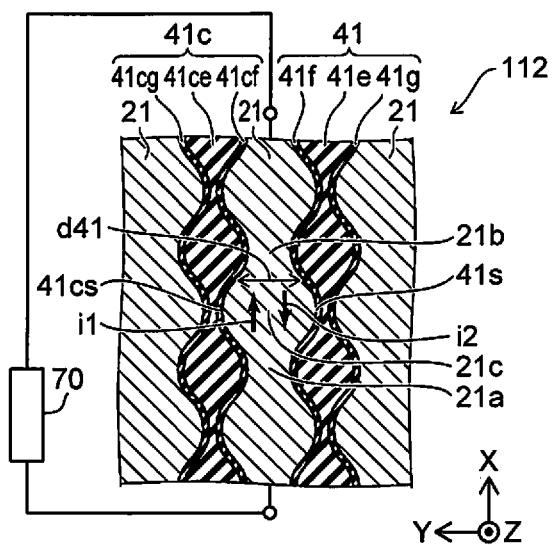
FIG. 4A to FIG. 4F are schematic views illustrating a magnetic memory device according to the first embodiment.
Figure 4B:
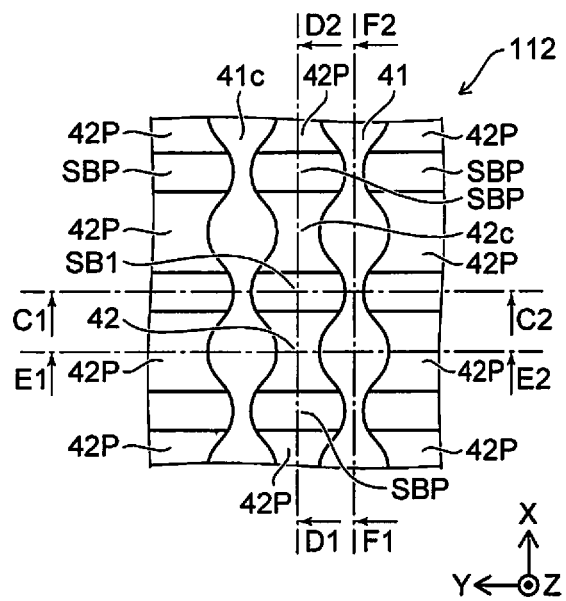
Figure 4C:
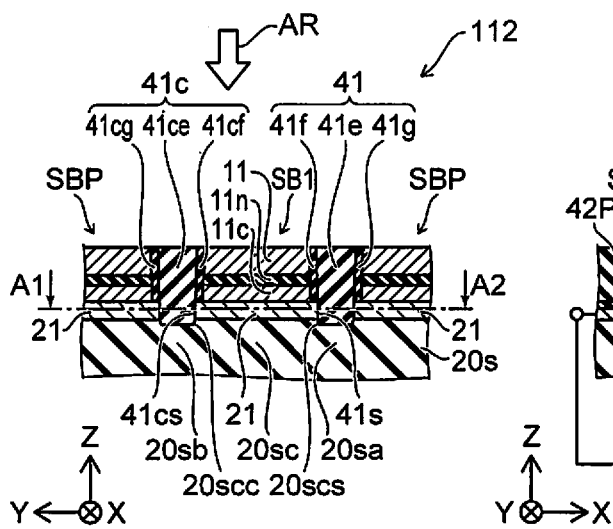
Figure 4D:
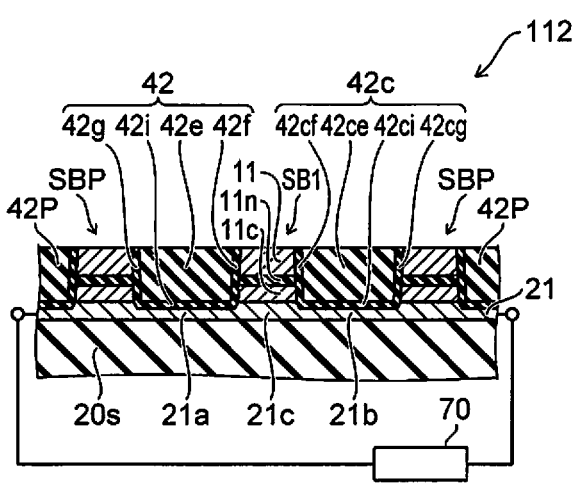
Figure 4E:
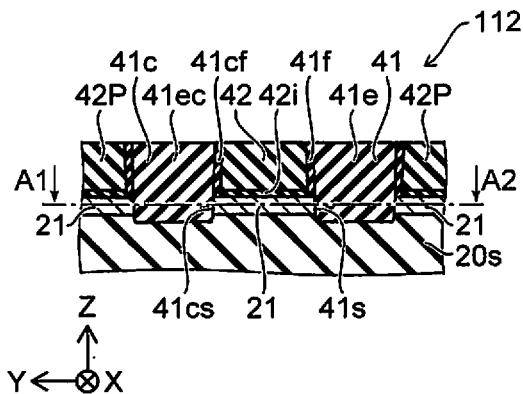
Figure 4F:
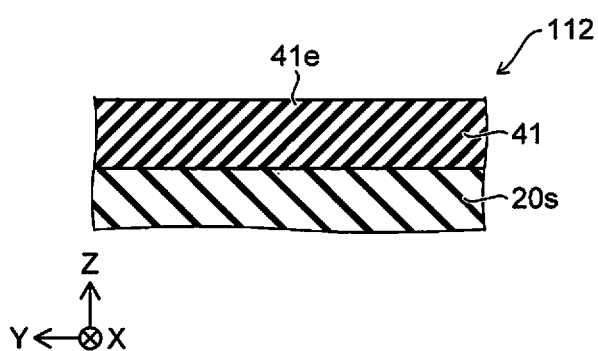

FIG. 4A is a line A1-A2 cross-sectional view of FIG. 4C and FIG. 4E. FIG. 4B is a plan view as viewed along arrow AR of FIG. 4C. FIG. 4C is a line C1-C2 cross-sectional view of FIG. 4B. FIG. 4D is a line D1-D2 cross-sectional view of FIG. 4B. FIG. 4E is a line E1-E2 cross-sectional view of FIG. 4B. FIG. 4F is a line F1-F2 cross-sectional view of FIG. 4B.

In the magnetic memory device 112 as shown in these drawings, the insulating regions have stacked structures. Otherwise, the configuration of the magnetic memory device 112 may be similar to that of the magnetic memory device 110 or 111. An example of the structures of the insulating regions will now be described.

As shown in FIG. 4C, the first insulating region 41 includes, for example, a portion 41e, a portion 41f, and a portion 41g. For example, the portion 41f is between the portion 41g and the first magnetic element SB1 in the Y-axis direction. The portion 41e is between the portion 41g and the portion 41f in the Y-axis direction. The direction from a portion of the portion 41e toward the first conductive member 21 is aligned with the Y-axis direction. For example, a portion of the portion 41e opposes the first conductive member 21 in the Y-axis direction. The portion 41e may contact the first member 20s. For example, the material of the portion 41e is different from the material of the portion 41f. For example, the material of the portion 41e is different from the material of the portion 41g. Thus, the first insulating region 41 may have a stacked structure.

As shown in FIG. 4C, the first counter insulating region 41c may include, for example, a portion 41ce, a portion 41cf, and a portion 41cg.

For example, the portion 41f, the portion 41g, the portion 41cf, and the portion 41cg include silicon nitride. For example, the portion 41e and the portion 41ce include the first material recited above. The first material includes, for example, at least one selected from the group consisting of SOG, a porous material, a material including a silanol group, a material including a hydroxide group, a material including a hydrocarbon group, and a resin.

As shown in FIG. 4D, the second insulating region 42 includes, for example, a portion 42e, a portion 42f, a portion 42g, and a portion 42i. For example, the portion 42f is between the portion 42g and the first magnetic element SB1 in the X-axis direction. The portion 42e is between the portion 42g and the portion 42f in the X-axis direction. The portion 42i is provided between the portion 42e and the first member 20s in the Z-axis direction. For example, the material of the portion 42e is different from the material of the portion 42f. For example, the material of the portion 42e is different from the material of the portion 42g. For example, the material of the portion 42e is different from the material of the portion 42i. Thus, the second insulating region 42 may have a stacked structure.

As shown in FIG. 4D, the second counter insulating region 42c may include, for example, a portion 42ce, a portion 42cf, a portion 42cg, and a portion 42ci.

The portion 42f, the portion 42g, the portion 42i, the portion 42cf, the portion 42cg, and the portion 42ci include, for example, silicon nitride. For example, the portion 42e and the portion 42ce may include at least one selected from the group consisting of silicon oxide, silicon nitride, silicon oxynitride, and aluminum oxide.

For example, the portion 41f, the portion 41g, the portion 41cf, and the portion 41cg may include an element included in the first conductive member 21 and at least one selected from the group consisting of oxygen and nitrogen.

The portion 42f, the portion 42g, the portion 42i, the portion 42cf, the portion 42cg, and the portion 42ci may include, for example, an element included in the first conductive member 21 and at least one selected from the group consisting of oxygen and nitrogen.

In the magnetic memory devices 110 and 112 as shown in FIG. 1A and FIG. 4A, the width in the Y-axis direction of the first conductive member 21 is wide at the regions overlapping the magnetic elements SBP and narrow at the regions not overlapping the magnetic elements SBP. As described below, the relationship of the magnitudes of the widths may be reversed.

FIG. 5A to FIG. 5F are schematic views illustrating a magnetic memory device according to the first embodiment.

Figure 5A:
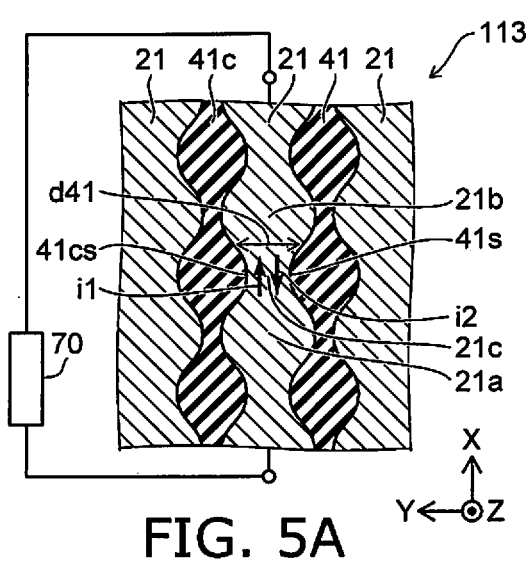
FIG. 5A to FIG. 5F are schematic views illustrating a magnetic memory device according to the first embodiment.
Figure 5B:
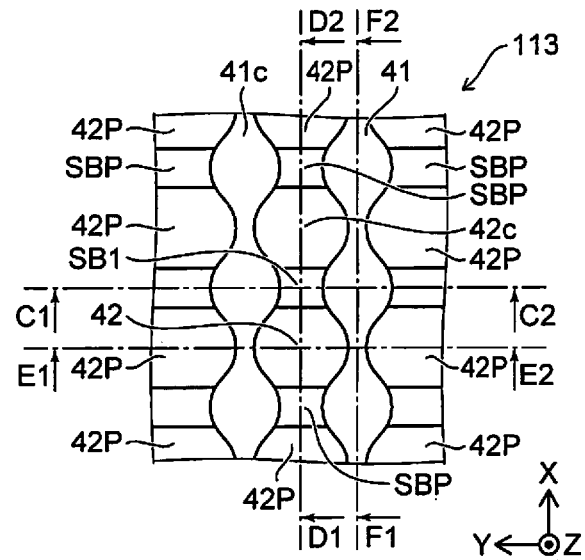
Figure 5C:
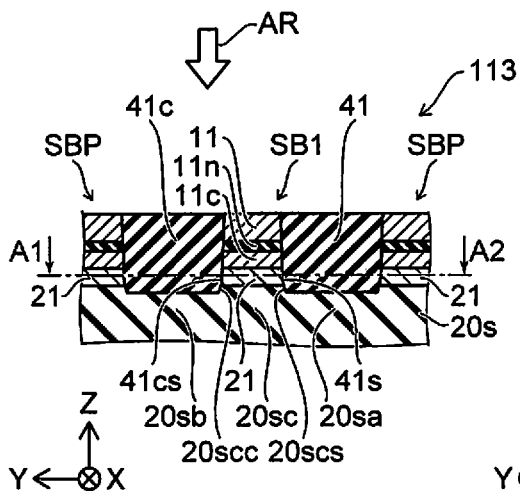
Figure 5D:
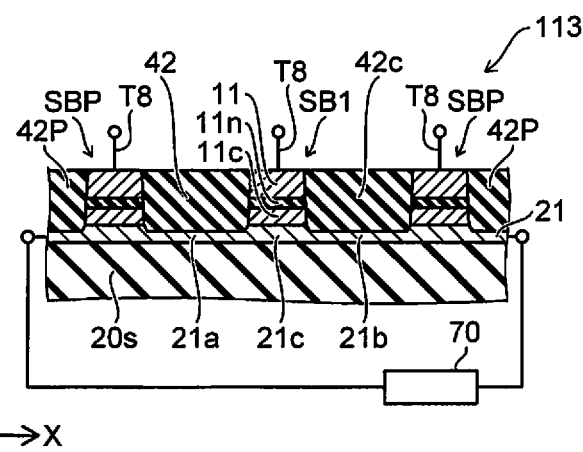
Figure 5E:
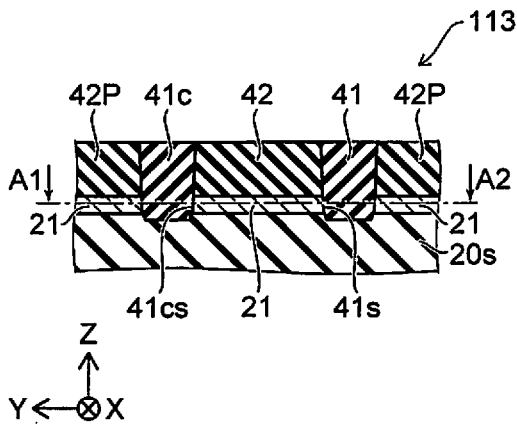
Figure 5F:
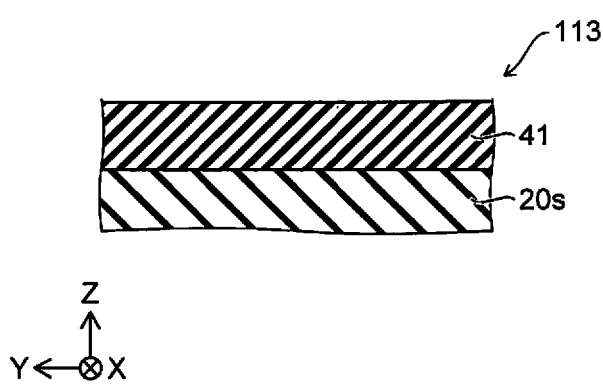

FIG. 5A is a line A1-A2 cross-sectional view of FIG. 5C and FIG. 5E. FIG. 5B is a plan view as viewed along arrow AR of FIG. 5C. FIG. 5C is a line C1-C2 cross-sectional view of FIG. 5B. FIG. 5D is a line D1-D2 cross-sectional view of FIG. 5B. FIG. 5E is a line E1-E2 cross-sectional view of FIG. 5B. FIG. 5F is a line F1-F2 cross-sectional view of FIG. 5B.

As shown in FIG. 5A, in the magnetic memory device 113 as well, a portion of the first insulating side surface 41s of the first insulating region 41 opposes the first conductive member 21 and is oblique to the first direction (the X-axis direction). A portion of the first counter insulating side surface 41cs of the first counter insulating region 41c opposes the first conductive member 21 and is oblique to the first direction.

The multiple first magnetic elements SB1 (the multiple magnetic elements SBP) may be provided. The distance along the second direction (e.g., the Y-axis direction) between the first insulating side surface 41s and the first counter insulating side surface 41cs is taken as the distance d41. The distance d41 may repeat an increase and decrease corresponding to the multiple first magnetic elements SB1 (the multiple magnetic elements SBP).

In the magnetic memory device 113 as shown in FIG. 5A, the distance d41 at the positions corresponding to the multiple first magnetic elements SB1 (the multiple magnetic elements SBP) is shorter than the distance d41 at the positions corresponding to the regions between the multiple first magnetic elements SB1 (the multiple magnetic elements SBP).

For example, the material of the first insulating region 41 may be different from the material of the second insulating region 42. For example, the first insulating region 41 may have at least one of the first to fourth concentrations, the first porosity, or the first density recited above.

As shown in FIG. 5C, the first member 20s may be further provided. The third member region 20sc of the first member 20s has the side surface 20scs crossing the second direction (the Y-axis direction). The first insulating region 41 may oppose at least a portion of the side surface 20scs in the second direction (e.g., the Y-axis direction).

In the magnetic memory device 113 as well, for example, the local stress generated in the first conductive member 21 is relaxed easily. Thereby, for example, stable operations are maintained easily even when the element size is reduced. A magnetic memory device can be provided in which the storage density can be increased.

In the magnetic memory device 113, similarly to the magnetic memory device 111, the first side surface 41as of the first insulating region 41 may be convex toward the first magnetic element SB1 in the first cross section including the second direction and the third direction (referring to FIG. 3A). The curvature of the first side surface 41as in the first cross section may be higher than the curvature of the second side surface 42as of the second insulating region 42 in the second cross section including the first direction and the third direction (referring to FIG. 3B). For example, the local stress generated in the first conductive member 21 is relaxed easily.

FIG. 6A to FIG. 6F are schematic views illustrating a magnetic memory device according to the first embodiment.

Figure 6A:
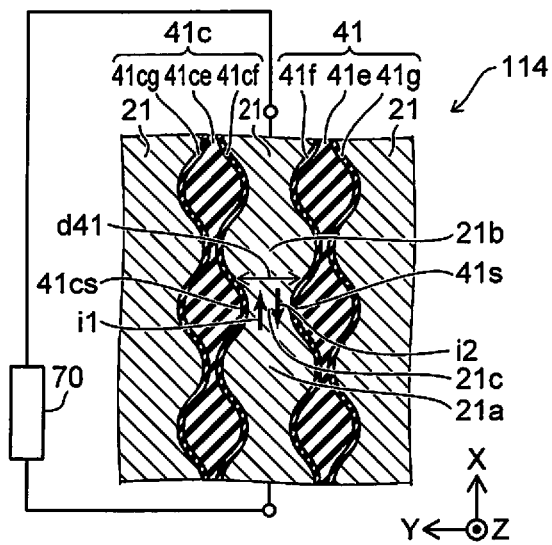
FIG. 6A to FIG. 6F are schematic views illustrating a magnetic memory device according to the first embodiment.
Figure 6B:
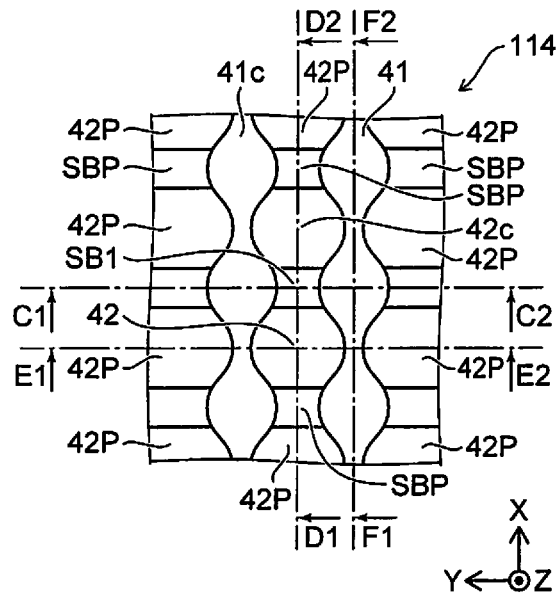
Figure 6C:
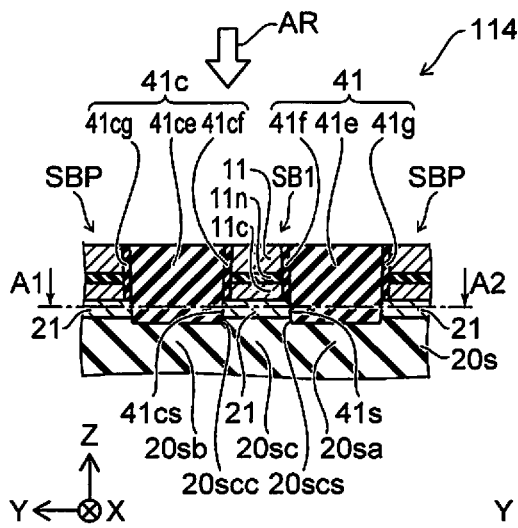
Figure 6D:
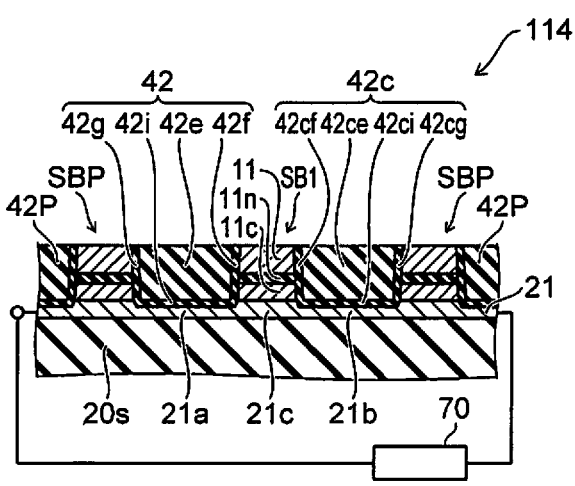
Figure 6E:
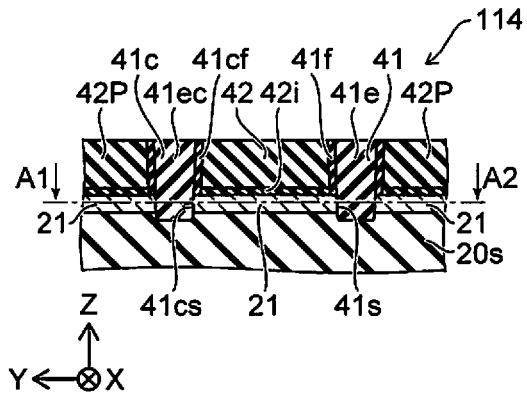
Figure 6F:
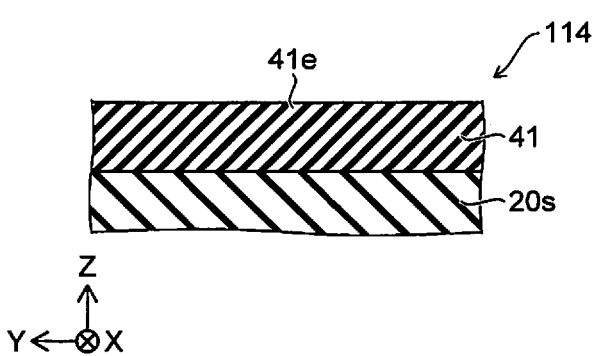
Figure 7A:
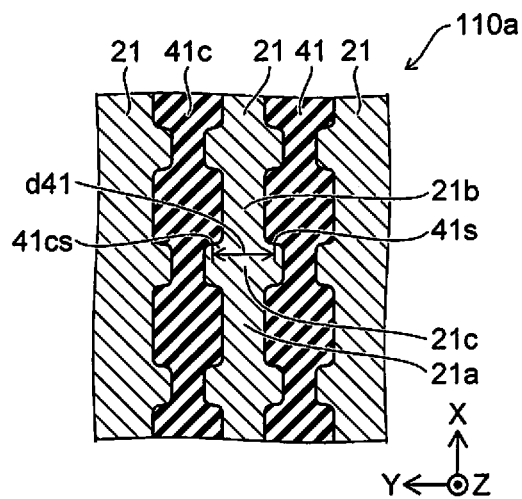
FIG. 7A and FIG. 7B are schematic views illustrating a magnetic memory device according to the first embodiment.
Figure 7B:
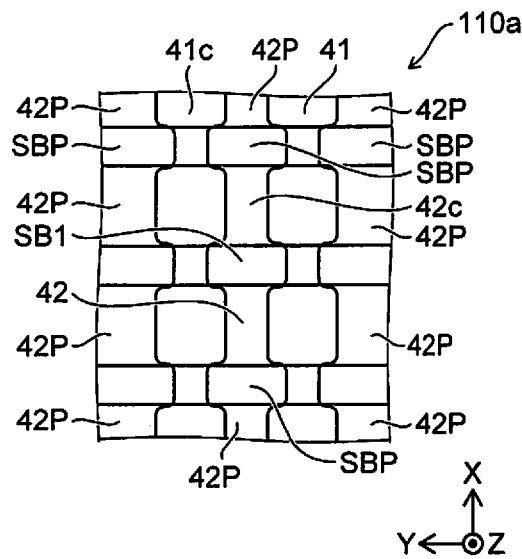
Figure 8A:
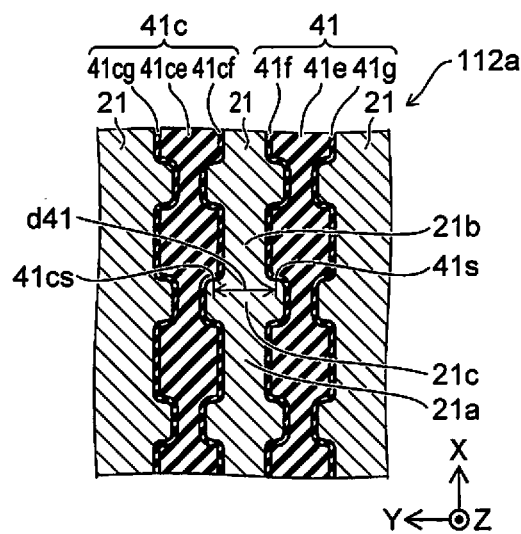
FIG. 8A and FIG. 8B are schematic views illustrating a magnetic memory device according to the first embodiment.
Figure 8B:
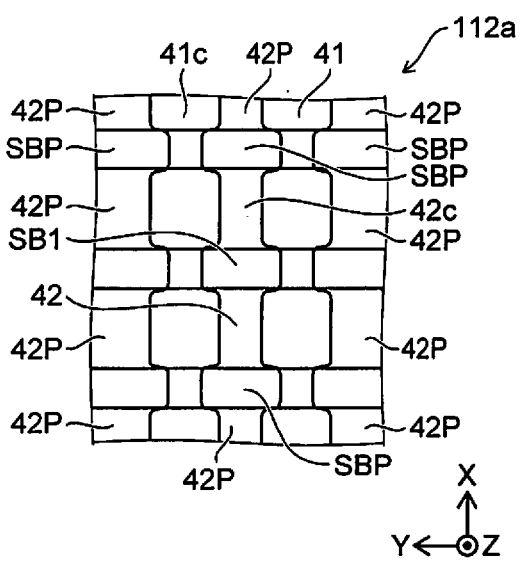
Figure 9A:
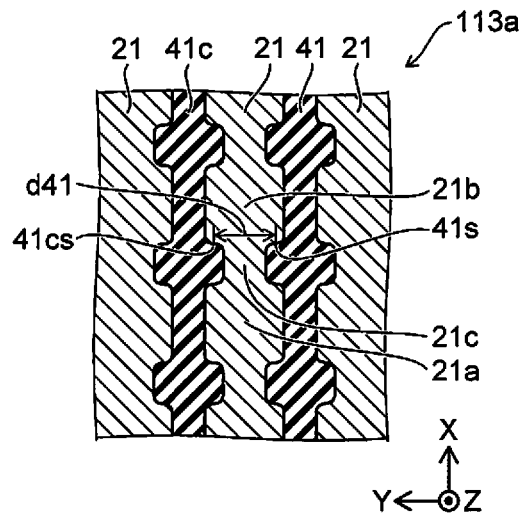
Figure 9B:
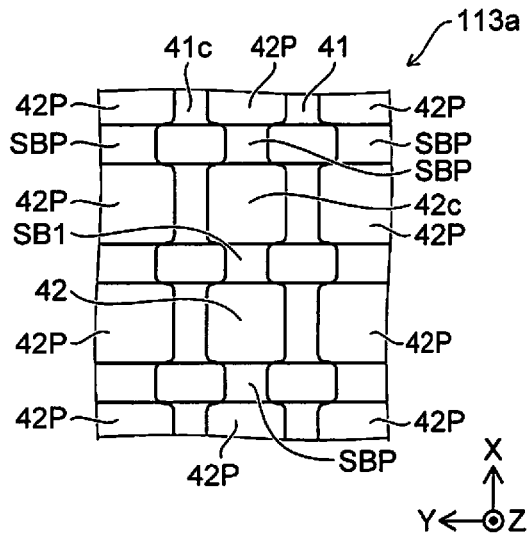
Figure 10A:
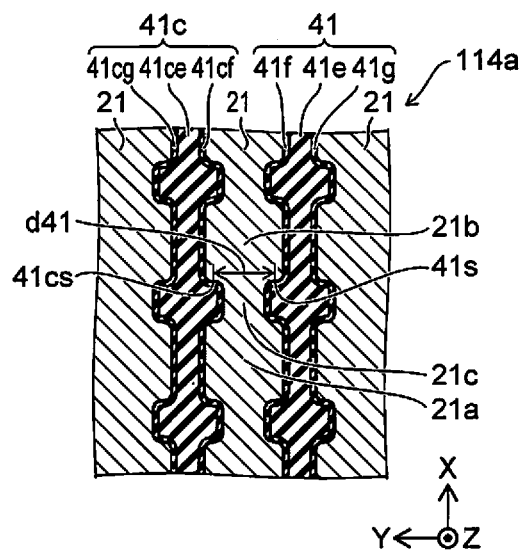
FIG. 10A and FIG. 10B are schematic views illustrating a magnetic memory device according to the first embodiment.
Figure 10B:
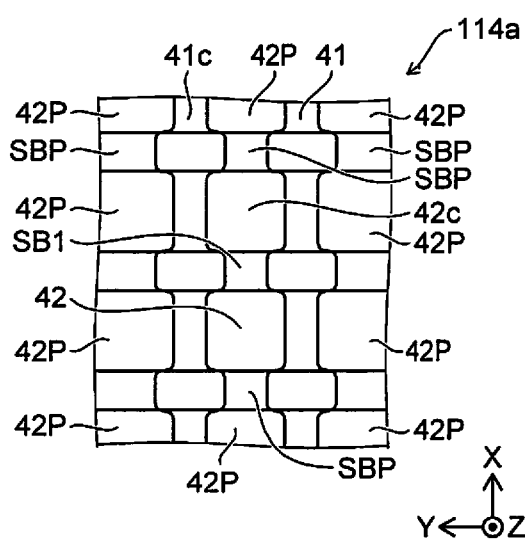

FIG. 6A is a line A1-A2 cross-sectional view of FIG. 6C and FIG. 6E. FIG. 6B is a plan view as viewed along arrow AR of FIG. 6C. FIG. 6C is a line C1-C2 cross-sectional view of FIG. 6B. FIG. 6D is a line D1-D2 cross-sectional view of FIG. 6B. FIG. 6E is a line E1-E2 cross-sectional view of FIG. 6B. FIG. 6F is a line F1-F2 cross-sectional view of FIG. 6B.

In the magnetic memory device 114 as shown in these drawings, the insulating regions have stacked structures. Otherwise, the configuration of the magnetic memory device 114 may be similar to that of the magnetic memory device 113.

For example, as shown in FIG. 6C, the first insulating region 41 includes, for example, the portion 41e, the portion 41f, and the portion 41g. As shown in FIG. 6C, the first counter insulating region 41c may include, for example, the portion 41ce, the portion 41cf, and the portion 41cg. As shown in FIG. 6D, the second insulating region 42 includes, for example, the portion 42e, the portion 42f, the portion 42g, and the portion 42i. As shown in FIG. 6D, the second counter insulating region 42c may include, for example, the portion 42ce, the portion 42cf, the portion 42cg, and the portion 42ci.

FIG. 7A, FIG. 7B, FIG. 8A, FIG. 8B, FIG. 9A, FIG. 9B, FIG. 10A, and FIG. 10B are schematic views illustrating magnetic memory devices according to the first embodiment. FIG. 7A, FIG. 8A, FIG. 9A, and FIG. 10A are cross-sectional views corresponding to FIG. 1A. FIG. 7B, FIG. 8B, FIG. 9B, and FIG. 10B are plan views corresponding to FIG. 1B.

As in the magnetic memory devices 110a, 112a, 113a, and 114a shown in these drawings, a portion of the first insulating side surface 41s is oblique to the first direction (the X-axis direction); and another portion of the first insulating side surface 41s is aligned with the first direction. A portion of the first counter insulating side surface 41cs is oblique to the first direction; and another portion of the first counter insulating side surface 41cs is aligned with the first direction. Thus, by setting a portion of at least one of the first insulating side surface 41s or the first counter insulating side surface 41cs to be oblique to the X-axis direction, the stress that is generated when the local temperature increase, expansion, etc., occur can be dispersed. Stable operations can be maintained. A magnetic memory device can be provided in which the storage density can be increased.

The distance d41 which is the distance along the second direction (e.g., the Y-axis direction) between the first insulating side surface 41s and the first counter insulating side surface 41cs may repeat an increase and decrease corresponding to the multiple first magnetic elements SB1 (the multiple magnetic elements SBP).

FIG. 11A to FIG. 11D are schematic views illustrating magnetic memory devices according to the first embodiment.

Figure 11A:
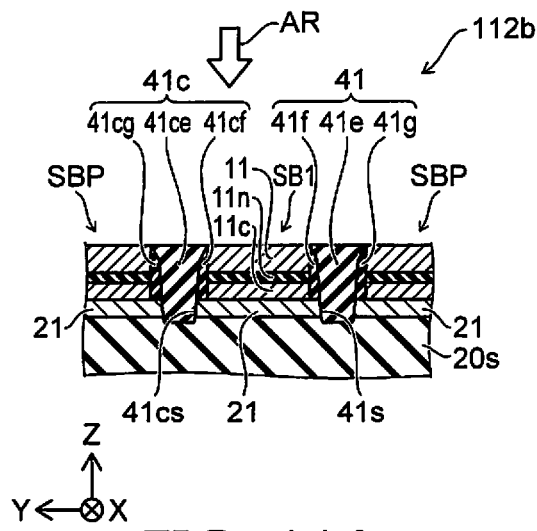
FIG. 11A to FIG. 11D are schematic views illustrating magnetic memory devices according to the first embodiment.
Figure 11B:
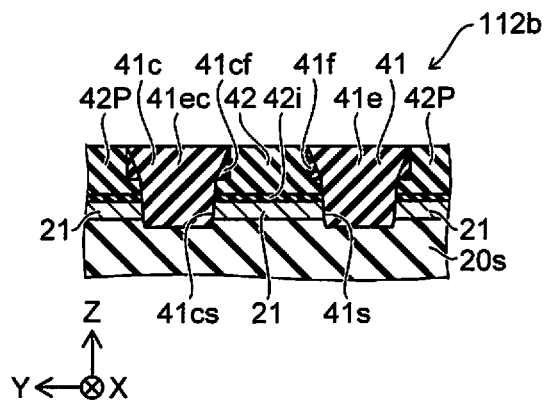
Figure 11C:
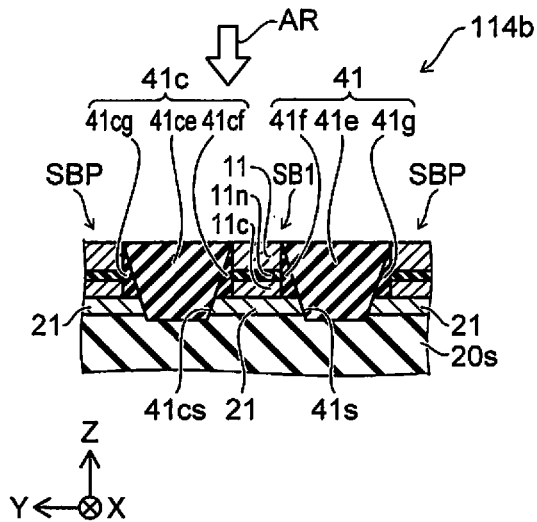
Figure 11D:
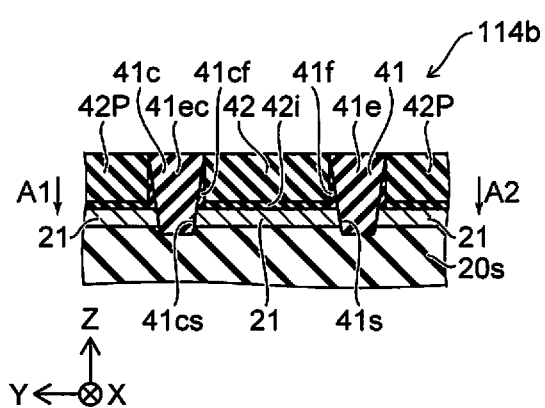

FIG. 11A and FIG. 11C are cross-sectional views at a position corresponding to line C1-C2 of FIG. 1B. FIG. 11B and FIG. 11D are cross-sectional views corresponding to line E1-E2 of FIG. 1B.

As in a magnetic memory device 112b shown in FIG. 11A and FIG. 11B, the length (the thickness) in the Y-axis direction may decrease from the first conductive member 21 toward the first magnetic layer 11 for each of the portions 41f, 41g, 41cf, and 41cg.

As shown in FIG. 11B, a portion of the second insulating region 42 may be provided between the portion 41f and the first conductive member 21. In the embodiment, for example, by providing the portion 41f, the stress that concentrates at the end portion of the first conductive member 21 can be reduced. By providing the portion of the second insulating region 42 between the portion 41f and the first conductive member 21, the stress can be reduced more effectively.

In a magnetic memory device 114b as shown in FIG. 11C and FIG. 11D as well, the length (the thickness) in the Y-axis direction may decrease from the first conductive member 21 toward the first magnetic layer 11 for each of the portions 41f, 41g, 41cf, and 41cg.

Figure 12:
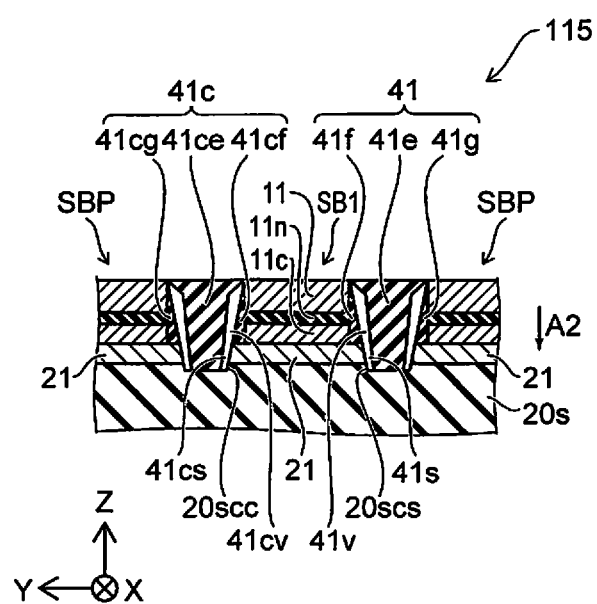
FIG. 12 is a schematic cross-sectional view illustrating a magnetic memory device according to the first embodiment.

FIG. 12 is a schematic cross-sectional view illustrating a magnetic memory device according to the first embodiment.

FIG. 12 is a cross-sectional view at a position corresponding to line C1-C2 of FIG. 1B. In the magnetic memory device 115 as shown in FIG. 12, a gap 41v (e.g., a void) is provided between the portion 41e and the first magnetic element SB1 in the second direction (e.g., the Y-axis direction). A gap 41cv (e.g., a void) is provided between the portion 41ce and the first magnetic element SB1. Otherwise, the configuration of the magnetic memory device 115 is similar to that of the magnetic memory device 112 or 112a.

For example, in the magnetic memory device 115, similarly to the magnetic memory device 112, a gap is not provided between the portion 42e and the first magnetic element SB1 in the first direction (the X-axis direction) (e.g., referring to FIG. 4B). Or, the gap that is between the portion 42e and the first magnetic element SB1 is smaller than the gap between the portion 41e and the first magnetic element SB1.

Thus, because the gap 41v is provided between the first magnetic element SB1 and the insulating member (the portion 41e, etc.) in the Y-axis direction and a gap is not provided between the first magnetic element SB1 and the insulating member (the portion 42e, etc.) in the X-axis direction, for example, the stress that is generated when the local temperature increase, expansion, etc., occur in the first conductive member 21 can be dispersed. The damage of the first conductive member 21 can be suppressed. The operations are stabilized. As a result, for example, the storage density can be increased.

For example, the portion 41f and the portion 41cf may be considered to be insulating regions other than the first insulating region 41. In such a case, the portion 42e corresponds to the first insulating region 41. For example, the other insulating regions (the portion 41f, the portion 41cf, etc.) are provided between the first insulating region 41 (the portion 41e) and the first magnetic element SB1 in the second direction (the Y-axis direction). A void (the gap 41v, the gap 41cv, etc.) may be provided in at least a portion between the first insulating region 41 (the portion 41e) and the other insulating regions (the portion 41f, the portion 41cf, etc.). The stress is dispersed effectively; and the operations are stabilized. As a result, for example, the storage density is increased easily.

The gap 41v, the gap 41cv, etc., can be formed by adjusting the formation conditions of the first insulating region 41, etc.

The gap 41v, the gap 41cv, etc., are applicable to any magnetic memory device or modification of any magnetic memory device according to the first embodiment.

Figure 13A:
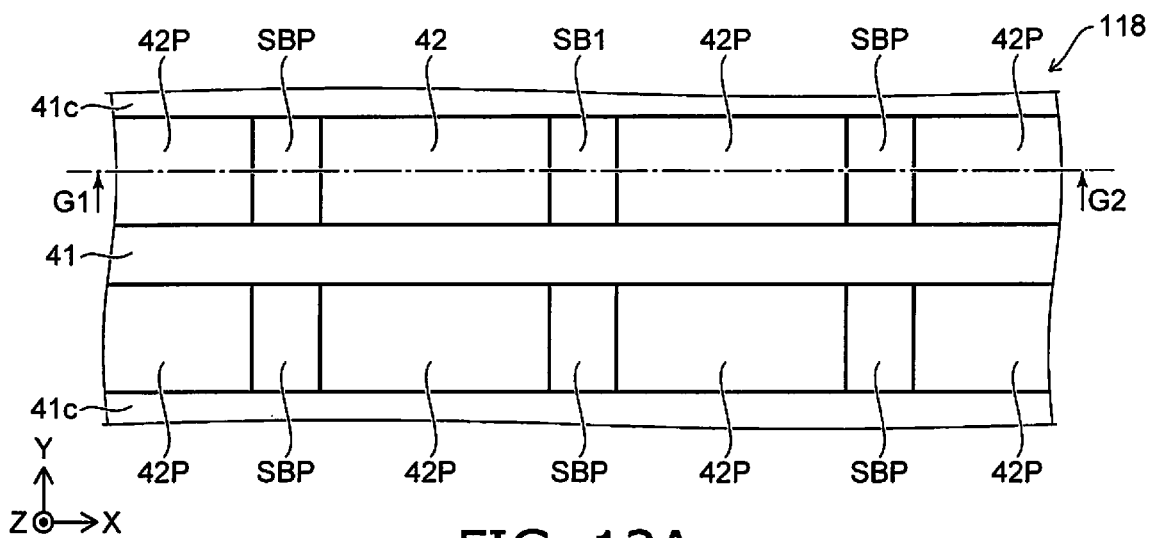
FIG. 13A to FIG. 13C are schematic views illustrating a magnetic memory device according to the first embodiment.
Figure 13B:
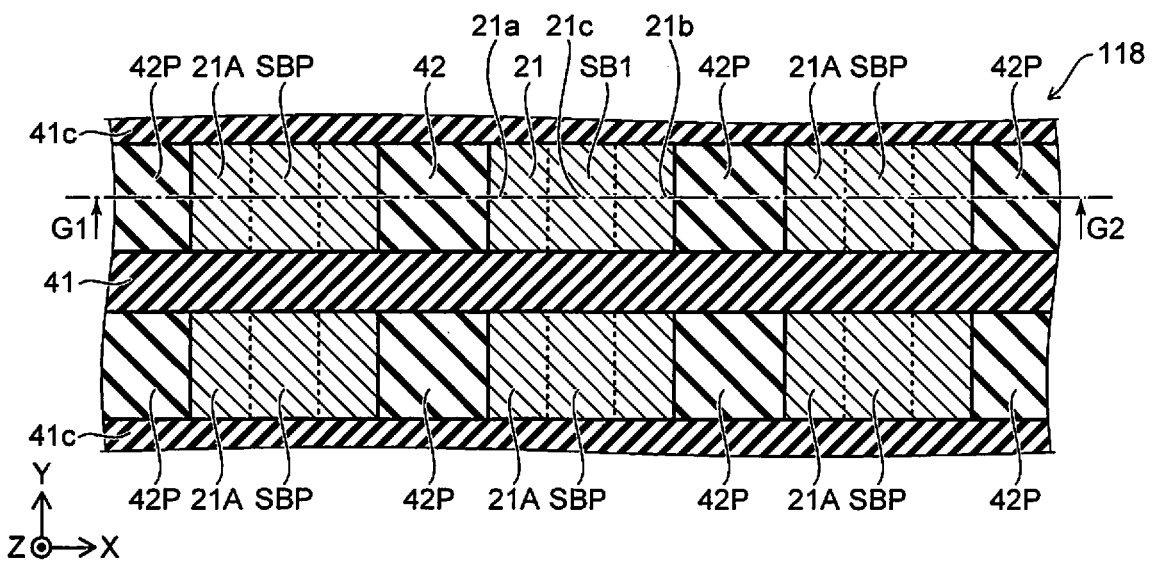
Figure 13C:
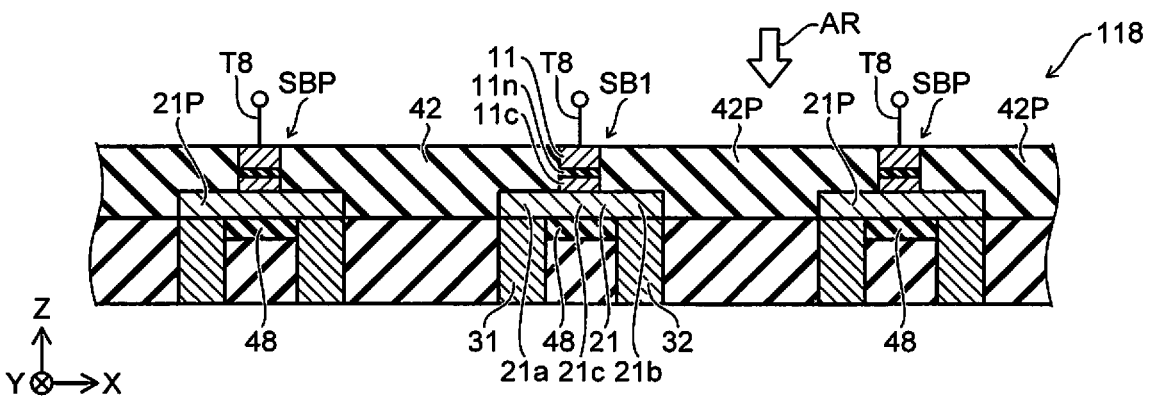

FIG. 13A to FIG. 13C are schematic views illustrating a magnetic memory device according to the first embodiment.

FIG. 13A is a plan view as viewed along arrow AR of FIG. 13C. FIG. 13B is a cross-sectional view of a plane including the first conductive member 21. FIG. 13C is a line G1-G2 cross-sectional view of FIG. 13A.

As shown in FIG. 13A and FIG. 13C, the magnetic memory device 118 according to the embodiment includes the first conductive member 21, the first insulating region 41, the second insulating region 42, and the first magnetic element SB1.

As shown in FIG. 13C, the first conductive member 21 includes the first portion 21a, the second portion 21b, and the third portion 21c. The third portion 21c is provided between the first portion 21a and the second portion 21b. The direction from the first portion 21a toward the second portion 21b is aligned with the first direction. The first direction is, for example, the X-axis direction. In one example, the first conductive member 21 extends along the first direction. For example, the length of the first conductive member 21 along the first direction may be longer than the length of the first conductive member 21 along a direction crossing the first direction.

As shown in FIG. 13B, the second direction from the first insulating region 41 toward the first conductive member 21 crosses the first direction. The second direction is, for example, the Y-axis direction.

The direction from the second insulating region 42 toward the first conductive member 21 is aligned with the first direction. The material of the first insulating region 41 is different from the material of the second insulating region 42.

As shown in FIG. 13C, the third direction from the third portion 21c toward the first magnetic element SB1 crosses a plane (e.g., the X-Y plane) including the first direction and the second direction. The third direction is, for example, the Z-axis direction.

In the magnetic memory device 118, the material of the first insulating region opposing the first conductive member 21 in the Y-axis direction is different from the material of the second insulating region opposing the first conductive member 21 in the X-axis direction. Thereby, anisotropy is generated in the stress applied to the first conductive member 21. Thereby, for example, anisotropy may be generated in the characteristics (e.g., the conductivity, etc.) of the first conductive member 21. For example, anisotropy may be generated in the characteristics (e.g., the conductivity, etc.) of the first conductive member 21. For example, the uniformity of the orientation of the current flowing through the first conductive member 21 increases. For example, the uniformity of the effect (e.g., the spin Hall effect) applied from the first conductive member 21 to the first counter magnetic layer 11c increases. More stable operations are obtained.

The stress that is generated in the first conductive member 21 may be relaxed by setting the material of the first insulating region opposing the first conductive member 21 in the Y-axis direction to be different from the material of the second insulating region opposing the first conductive member 21 in the X-axis direction. For example, the length in the X-axis direction of the first conductive member 21 is different from the length in the Y-axis direction of the first conductive member 21. For example, there are cases where anisotropy occurs in the stress generated in the first conductive member 21 due to the effects of thermal expansion, etc. Due to such stress, there are cases where a large stress concentrates locally in the first conductive member 21 and the insulating regions around the first conductive member 21. Because the stress due to the insulating region material difference is relaxed, the concentration of the stress is suppressed. For example, the damage of the first conductive member 21 can be suppressed. For example, the damage of the first insulating region 41 and the insulating regions can be suppressed. The operations are stabilized. For example, stable operations can be maintained even when the element size is reduced. The storage density can be increased.

In the magnetic memory device 118, for example, the first insulating region 41 may have at least one of the first concentration higher than the concentration of the silanol group included in the second insulating region 42, the second concentration higher than the concentration of the hydroxide group included in the second insulating region 42, the third concentration higher than the concentration of the hydrocarbon group included in the second insulating region 42, the fourth concentration higher than the concentration of the imide group included in the second insulating region 42, a porosity higher than the porosity of the second insulating region 42, or a density lower than the density of the second insulating region 42.

As shown in FIG. 13A to FIG. 13C, a plurality of a set including the first conductive member 21 and the first magnetic element SB1 may be provided. One set includes a conductive member 21A and the magnetic element SBP. The multiple sets are arranged in the X-axis direction. The multiple sets are arranged in the Y-axis direction. One of the multiple sets is provided between the second insulating region 42 and the insulating region 42P. Or, one of the multiple sets is provided between one of the multiple insulating regions 42P and another one of the multiple insulating regions 42P.

The first insulating region 41 is provided between the first counter insulating region 41c and another first counter insulating region 41c in the Y-axis direction. The multiple sets including the conductive members 21A and the magnetic elements SBP are provided between the first counter insulating region 41c and the first insulating region 41 in the Y-axis direction. Other multiple sets including the conductive members 21A and the magnetic elements SBP are provided between the other first counter insulating region 41c and the first insulating region 41 in the Y-axis direction.

As shown in FIG. 13C, a first connection member 31 and a second connection member 32 may be provided. The first connection member 31 is electrically connected to the first portion 21a. The second connection member 32 is electrically connected to the second portion 21b. These connection members and the terminals T8 are electrically connected to the controller 70 (referring to FIG. 1A, etc.).

An insulating layer 48 may be provided as shown in FIG. 13C. The direction from the insulating layer 48 toward the first magnetic element SB1 is aligned with the third direction (e.g., the Z-axis direction). For example, the first conductive member 21 is provided between the insulating layer 48 and the first magnetic element SB1. For example, the insulating layer 48 may adjust the stress of the first conductive member 21. For example, the insulating portions that are provided around the first conductive member 21 are stabilized. For example, the characteristics of the first conductive member 21 are stabilized by the adjustment of the stress. The insulating layer 48 may be provided at a portion of the first conductive member 21. For example, the first conductive member 21 may include a portion overlapping the insulating layer 48 and a portion not overlapping the insulating layer 48 in the Z-axis direction. The insulating layer 48 may be provided in the magnetic memory devices recited above according to the first embodiment.

In the magnetic memory device 118, the lattice length along the first direction of the first conductive member 21 may be different from the lattice length along the second direction of the first conductive member 21.

In the magnetic memory device 118, for example, the first insulating region 41 may include the first side surface 41as opposing the first magnetic element SB1 in the second direction (referring to FIG. 3A). The second insulating region 42 may include the second side surface 42as opposing the first magnetic element SB1 in the first direction (referring to FIG. 3A). The first side surface 41as may be convex toward the first magnetic element SB1 in the first cross section including the second direction and the third direction (referring to FIG. 3A). The curvature of the first side surface 41as in the first cross section may be higher than the curvature of the second side surface 42as in the second cross section including the first direction and the third direction (referring to FIG. 3A and FIG. 3B).

For example, the magnetic memory device 118 may further include the first member 20s (referring to FIG. 1C). The first member 20s may include the first member region 20sa, the second member region 20sb, and the third member region 20sc (referring to FIG. 1C). The third member region 20sc is between the first member region 20sa and the second member region 20sb in the second direction (e.g., the Y-axis direction). The direction from the first member region 20sa toward the second member region 20sb is aligned with the second direction (referring to FIG. 1C). The direction from the first member region 20sa toward the first insulating region 41 is aligned with the third direction (e.g., the Z-axis direction). The direction from the third member region 20sc toward the first magnetic element SB1 is aligned with the third direction. The direction from the second member region 20sb toward the first counter insulating region 41c is aligned with the third direction (e.g., the Z-axis direction) (referring to FIG. 1C). The third member region 20sc of the first member 20s has the side surface 20scs crossing the second direction (e.g., the Y-axis direction). The first insulating region 41 may oppose at least a portion of the side surface 20scs in the second direction (e.g., the Y-axis direction) (referring to FIG. 1C).

Second Embodiment

FIG. 14A to FIG. 14C, FIG. 15A, and FIG. 15B are schematic views illustrating a magnetic memory device according to a second embodiment.

Figure 14A:
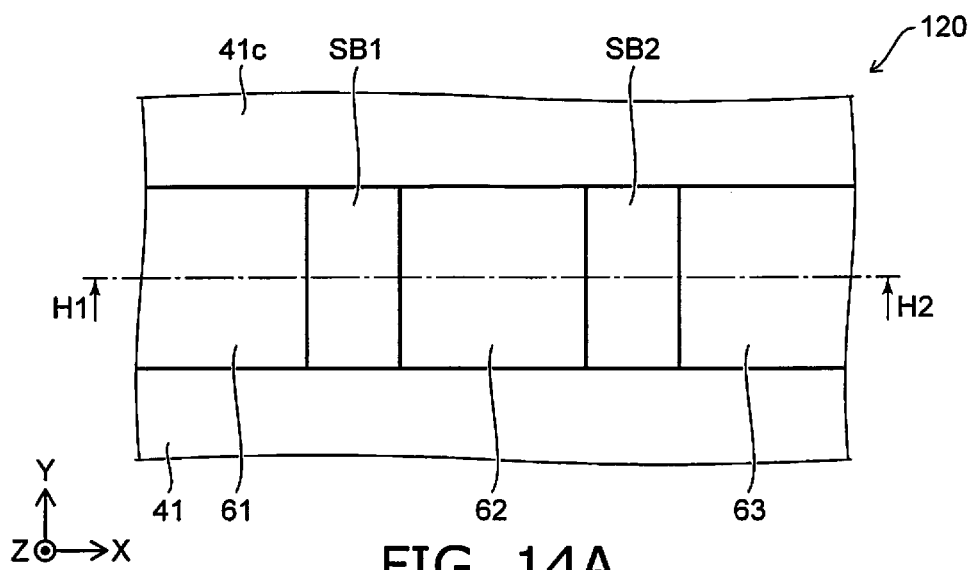
FIG. 14A to FIG. 14C are schematic views illustrating a magnetic memory device according to a second embodiment.
Figure 14B:
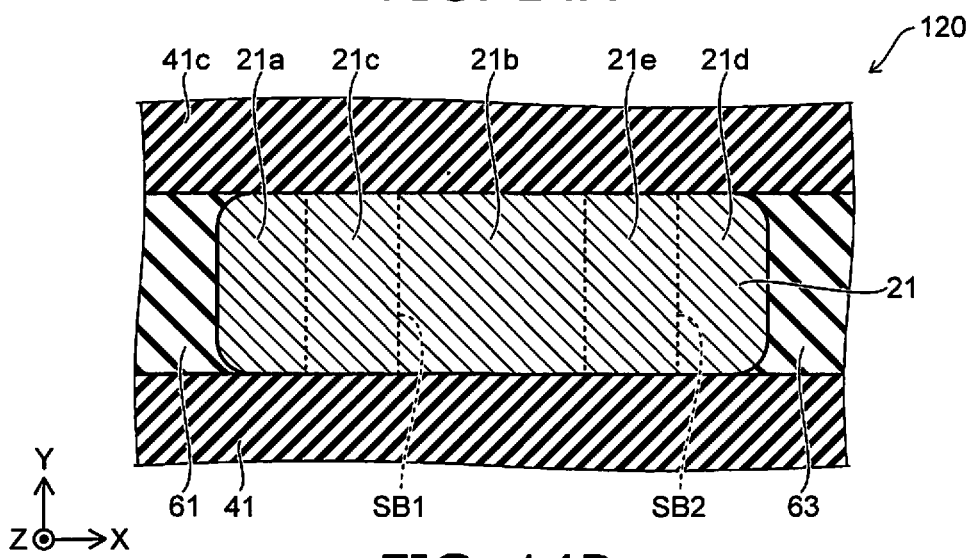
Figure 14C:
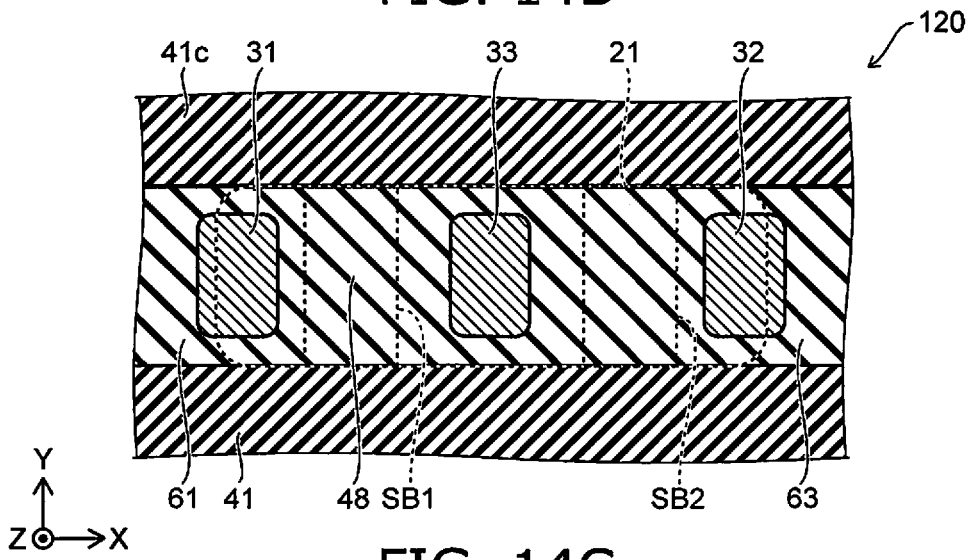
Figure 15A:
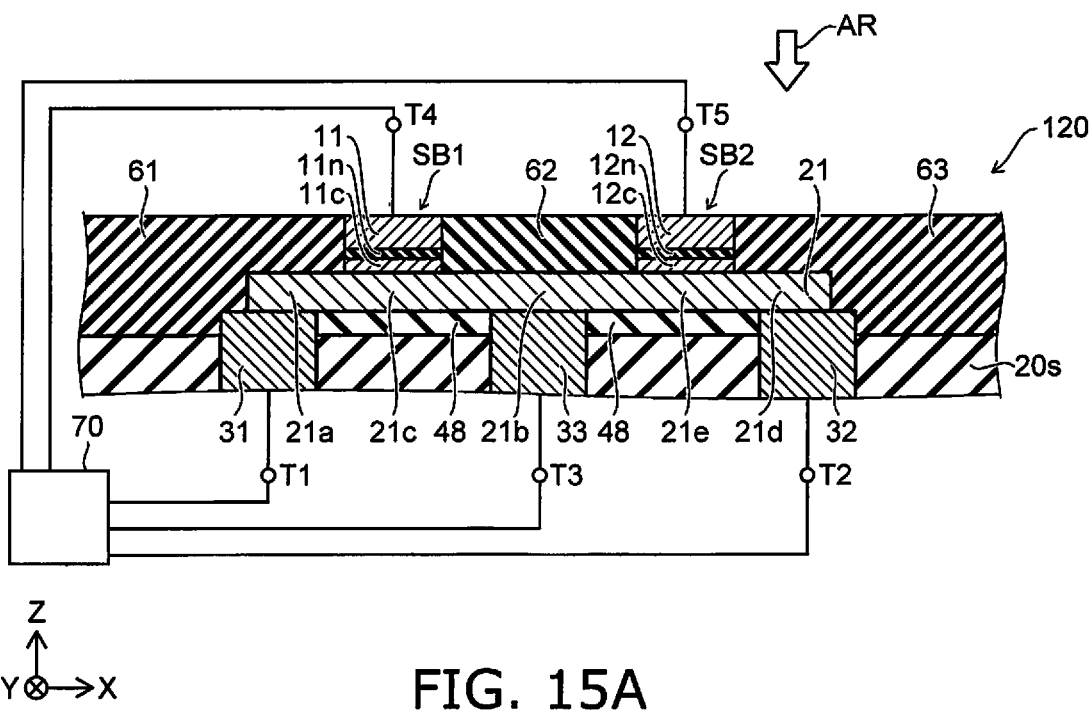
FIG. 15A and FIG. 15B are schematic views illustrating the magnetic memory device according to the second embodiment.
Figure 15B:
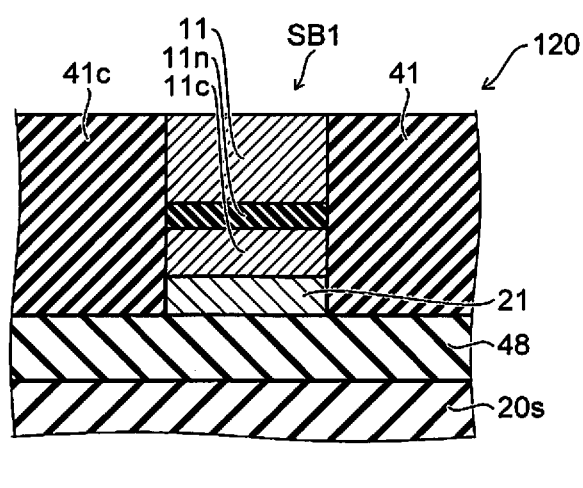

FIG. 14A is a plan view as viewed along arrow AR of FIG. 15A. FIG. 15A is a line H1-H2 cross-sectional view of FIG. 14A. FIG. 14B and FIG. 14C are cross-sectional views cut by the X-Y plane. FIG. 14B is a cross-sectional view of a plane including the first conductive member 21. FIG. 14B is a cross-sectional view of a plane including first to third connection members 31 to 33 described below. FIG. 15B is a cross-sectional view cut by the Y-Z plane.

As shown in FIG. 15A, the magnetic memory device 120 according to the embodiment includes a first insulating portion 61, a second insulating portion 62, a third insulating portion 63, the first conductive member 21, the first magnetic element SB1, and a second magnetic element SB2. Thus, in the magnetic memory device 120, two magnetic elements are provided at one first conductive member 21. The magnetic memory device 120 may further include the controller 70.

The second insulating portion 62 is between the first insulating portion 61 and the third insulating portion 63 in the first direction which is from the first insulating portion 61 toward the third insulating portion 63. The first direction is, for example, the X-axis direction.

The first conductive member 21 is provided between at least a portion of the first insulating portion 61 and at least a portion of the third insulating portion 63. The first conductive member 21 extends along the first direction.

The first magnetic element SB1 is provided between the first insulating portion 61 and the second insulating portion 62. The direction from the first conductive member 21 toward the first magnetic element SB1 is aligned with the third direction. The third direction crosses the first direction. The third direction is, for example, the Z-axis direction.

The second magnetic element SB2 is provided between the second insulating portion 62 and the third insulating portion 63. The direction from the first conductive member 21 toward the second magnetic element SB2 is aligned with the third direction.

As shown in FIG. 14B and FIG. 15A, for example, the first conductive member 21 includes the first to fifth portions 21a to 21e. The first portion 21a is between the third insulating portion 63 and a portion of the first insulating portion 61. The second portion 21b is between the first portion 21a and the third insulating portion 63. The third portion 21c is between the first portion 21a and the second portion 21b. The fourth portion 21d is between the second portion 21b and the third insulating portion 63. The fifth portion 21e is between the second portion 21b and the fourth portion 21d.

The first magnetic element SB1 includes the first magnetic layer 11, the first counter magnetic layer 11c, and the first nonmagnetic layer 11n. The first counter magnetic layer 11c is provided between the third portion 21c and the first magnetic layer 11 in the Z-axis direction. The first nonmagnetic layer 11n is provided between the first magnetic layer 11 and the first counter magnetic layer 11c.

The second magnetic element SB2 includes a second magnetic layer 12, a second counter magnetic layer 12c, and a second nonmagnetic layer 12n. The second counter magnetic layer 12c is provided between the fifth portion 21e and the second magnetic layer 12 in the Z-axis direction. The second nonmagnetic layer 12n is provided between the second magnetic layer 12 and the second counter magnetic layer 12c.

The first connection member 31, the second connection member 32, and the third connection member 33 are provided in the example (referring to FIG. 14C and FIG. 15A). The first connection member 31 is electrically connected to the first portion 21a. The second connection member 32 is electrically connected to the fourth portion 21d. The third connection member 33 is electrically connected to the second portion 21b. The first connection member 31, the second connection member 32, and the third connection member 33 are electrically connected respectively to a first terminal T1, a second terminal T2, and a third terminal T3.

A fourth terminal T4 is electrically connected to the first magnetic layer 11. A fifth terminal T5 is electrically connected to the second magnetic layer 12. The controller 70 is electrically connected to the first to fifth terminals T1 to T5.

For example, the controller 70 performs first to third operations. In the first operation, the controller 70 supplies a first current from the first terminal T1 toward the third terminal T3, and supplies a second current from the second terminal T2 toward the third terminal T3. In the second operation, the controller 70 supplies a third current from the third terminal T3 toward the first terminal T1, and supplies a fourth current from the third terminal T3 toward the second terminal T2. One resistance state is obtained in the set of the two magnetic elements by the first operation. Another one resistance state is obtained in the set of the two magnetic elements by the second operation. For example, the first operation corresponds to the write operation of one of "1" or "0." For example, the second operation corresponds to the write operation of the other of "1" or "0."

In the third operation, the controller 70 applies a voltage between the fourth terminal T4 and the fifth terminal T5 (between the first magnetic layer 11 and the second magnetic layer 12) and detects the potential of the third terminal T3 (the second portion 21b). The potential of the third terminal T3 (the second portion 21b) is different between the multiple resistance states. The multiple resistance states (the multiple memory states) can be detected by detecting the potential of the third terminal T3 (the second portion 21b).

In one example of the magnetic memory device 120, the material of the first insulating portion 61 is different from the material of the second insulating portion 62. For example, the material of the third insulating portion 63 is different from the material of the second insulating portion 62. The material of the third insulating portion 63 may be the same as the material of the first insulating portion 61.

For example, the first insulating portion 61 and the third insulating portion 63 include, for example, silicon nitride. The second insulating portion 62 includes, for example, silicon oxide.

In the first conductive member 21, the amount of the increase of the temperature is different between the central portion (the second portion 21b) and the end portions (the first portion 21a and the fourth portion 21d). For example, in the first conductive member, the expansion is different between the central portion and the end portions. By changing the material between the first insulating portion 61 and the third insulating portion 63 positioned at the end portions and the second insulating portion 62 positioned at the central portion, the local stress generated by the nonuniformity of the temperature increase and the nonuniformity of the expansion can be relaxed.

In one example, the thermal expansion coefficients of the first insulating portion 61 and the third insulating portion 63 are larger than the thermal expansion coefficient of the second insulating portion 62.

As shown in FIG. 14A and FIG. 14B, the magnetic memory device 120 may further include the first insulating region 41 and the first counter insulating region 41c. The first magnetic element SB1 and the second magnetic element SB2 are provided between the first insulating region 41 and the first counter insulating region 41c in the second direction which is from the first insulating region 41 toward the first counter insulating region 41c.

In one example, the material of the first insulating portion 61 may be different from the material of the first insulating region 41. For example, the first insulating region 41 may have at least one of the first concentration higher than the concentration of the silanol group included in the first insulating portion 61, the second concentration higher than the concentration of the hydroxide group included in the first insulating portion 61, the third concentration higher than the concentration of the hydrocarbon group included in the first insulating portion 61, the fourth concentration higher than the concentration of the imide group included in the first insulating portion 61, the first porosity higher than the porosity of the first insulating portion 61, or the first density lower than the density of the first insulating portion 61.

For example, local stress is generated easily in the first conductive member 21 when the current flows in the first conductive member 21. The local stress can be relaxed easily by setting the materials of the first insulating portion 61 and the third insulating portion 63 opposing the first conductive member 21 in the X-axis direction and the materials of the first insulating region 41 and the first counter insulating region 41c opposing the first conductive member 21 in the Y-axis direction to be different from each other.

For example, the first insulating region 41 (and the first counter insulating region 41c) may be formed of SOG, a resin, etc. The first insulating portion 61 (and the third insulating portion 63) may be formed by CVD, etc.

In another example of the magnetic memory device 120, the material of the second insulating portion 62 may be different from the material of the first insulating region 41. In such a case as well, the local stress can be relaxed easily.

In such a case, the first insulating region 41 may have at least one of the first concentration higher than the concentration of the silanol group included in the second insulating portion 62, the second concentration higher than the concentration of the hydroxide group included in the second insulating portion 62, the third concentration higher than the concentration of the hydrocarbon group included in the second insulating portion 62, the fourth concentration higher than the concentration of the imide group included in the second insulating portion 62, a porosity higher than the porosity of the second insulating portion 62, or a density lower than the density of the second insulating portion 62.

The insulating layer 48 may be provided as shown in FIG. 14C, FIG. 15A, and FIG. 15B. The direction from the insulating layer 48 toward the first magnetic element SB1 is aligned with the third direction (e.g., the Z-axis direction). The direction from the insulating layer 48 toward the second magnetic element SB2 is aligned with the third direction. For example, the insulating layer 48 is provided between the first member 20s and the first conductive member 21. For example, the first conductive member 21 is provided between the insulating layer 48 and the first magnetic element SB1. For example, the insulating layer 48 may adjust the stress of the first conductive member 21. For example, the insulating portions that are provided around the first conductive member 21 are stabilized. For example, the characteristics of the first conductive member 21 are stabilized by the adjustment of the stress. The insulating layer 48 may be provided at a portion of the first conductive member 21. For example, the first conductive member may include a portion overlapping the insulating layer 48 and a portion not overlapping the insulating layer 48 in the Z-axis direction.

For example, the insulating layer 48 includes, for example, a first element which is at least one selected from the group consisting of Al, Si, Ti, Ta, Hf, Mg, B, Sc, Li, and Cr, and a second element which is at least one selected from the group consisting of oxygen and nitrogen.

FIG. 16A to FIG. 16C are schematic views illustrating a magnetic memory device according to the second embodiment.

FIG. 16A is a plan view as viewed along arrow AR of FIG. 16C. FIG. 16C is a line I1-I2 cross-sectional view of FIG. 16A. FIG. 16B is a cross-sectional view cut by the X-Y plane. FIG. 16B is a cross-sectional view of a plane including the first conductive member 21.

As shown in FIG. 16A and FIG. 16C, similarly to the magnetic memory device 120, the magnetic memory device 121 also includes the first insulating portion 61, the second insulating portion 62, the third insulating portion 63, the first conductive member 21, the first magnetic element SB1, and the second magnetic element SB2. The magnetic memory device 121 further includes a fourth insulating portion 64, a fifth insulating portion 65, a third magnetic element SB3, and a fourth magnetic element SB4.

As described above, the second insulating portion 62 is between the first insulating portion 61 and the third insulating portion 63 in the first direction (e.g., the X-axis direction) which is from the first insulating portion 61 toward the third insulating portion 63. The first conductive member 21 is provided between at least a portion of the first insulating portion and at least a portion of the third insulating portion 63 (referring to FIG. 16B). The first magnetic element SB1 is provided between the first insulating portion 61 and the second insulating portion 62. The direction from the first conductive member 21 toward the first magnetic element SB1 is aligned with the third direction (e.g., the Z-axis direction). The second magnetic element SB2 is provided between the second insulating portion 62 and the third insulating portion 63. The direction from the first conductive member 21 toward the second magnetic element SB2 is aligned with the third direction.

The fourth insulating portion 64 is between the third insulating portion 63 and the fifth insulating portion 65 in the first direction (the X-axis direction). A second conductive member 22 is provided between at least a portion of the third insulating portion 63 and at least a portion of the fifth insulating portion 65.

The third magnetic element SB3 is provided between the third insulating portion 63 and the fourth insulating portion 64. The direction from the second conductive member 22 toward the third magnetic element SB3 is aligned with the third direction (e.g., the Z-axis direction). The fourth magnetic element SB4 is provided between the fourth insulating portion 64 and the fifth insulating portion 65. The direction from the second conductive member 22 toward the fourth magnetic element SB4 is aligned with the third direction (e.g., the Z-axis direction).

The first conductive member 21 includes the first to fifth portions 21a to 21e. The direction from the first portion 21a toward the fourth portion 21d is aligned with the first direction (the X-axis direction). The second portion 21b is between the first portion 21a and the fourth portion 21d. The third portion 21c is between the first portion 21a and the second portion 21b. The fifth portion 21e is between the second portion 21b and the fourth portion 21d.

In the first magnetic element SB1 as shown in FIG. 16C, the first counter magnetic layer 11c is provided between the third portion 21c and the first magnetic layer 11. The first nonmagnetic layer 11n is provided between the first magnetic layer 11 and the first counter magnetic layer 11c. In the second magnetic element SB2, the second counter magnetic layer 12c is provided between the fifth portion 21e and the second magnetic layer 12. The second nonmagnetic layer 12n is provided between the second magnetic layer 12 and the second counter magnetic layer 12c.

The second conductive member 22 includes sixth to tenth portions 22f to 22j. The direction from the sixth portion 22f toward the ninth portion 22i is aligned with the first direction (the X-axis direction). The seventh portion 22g is between the sixth portion 22f and the ninth portion 22i. The eighth portion 22h is between the sixth portion 22f and the seventh portion 22g. The tenth portion 22j is between the seventh portion 22g and the ninth portion 22i. In the X-axis direction, the fourth portion 21d of the first conductive member 21 and the sixth portion 22f of the second conductive member 22 are between the first portion 21a of the first conductive member 21 and the ninth portion 22i of the second conductive member 22.

As shown in FIG. 16C, the third magnetic element SB3 includes a third magnetic layer 13, a third counter magnetic layer 13c, and a third nonmagnetic layer 13n. The third counter magnetic layer 13c is provided between the eighth portion 22h and the third magnetic layer 13. The third nonmagnetic layer 13n is provided between the third magnetic layer 13 and the third counter magnetic layer 13c. The fourth magnetic element SB4 includes a fourth magnetic layer 14, a fourth counter magnetic layer 14c, and a fourth nonmagnetic layer 14n. The fourth counter magnetic layer 14c is provided between the tenth portion 22j and the fourth magnetic layer 14. The fourth nonmagnetic layer 14n is provided between the fourth magnetic layer 14 and the fourth counter magnetic layer 14c.

As shown in FIG. 16C, the third insulating portion 63 includes a first region 63a, a second region 63b, and a third region 63c. The direction from a portion (the fourth portion 21d) of the first conductive member 21 toward the first region 63a of the third insulating portion 63 is aligned with the third direction. The direction from a portion (the sixth portion 22f) of the second conductive member 22 toward the second region 63b of the third insulating portion 63 is aligned with the third direction. The third region 63c of the third insulating portion 63 is between the first conductive member 21 and the second conductive member 22 in the first direction (e.g., the X-axis direction). For example, the end portion (the fourth portion 21d) of the first conductive member 21 is held in the Z-axis direction and the X-axis direction by the first region 63a and the third region 63c of the third insulating portion 63. For example, the end portion (the sixth portion 22f) of the second conductive member 22 is held in the Z-axis direction and the X-axis direction by the second region 63b and the third region 63c of the third insulating portion 63. Deformation and the like of the first conductive member 21 and the second conductive member 22 are suppressed because the first conductive member 21 and the second conductive member 22 are held stably.

As shown in FIG. 16C, a first connector EC1 and a second connector EC2 may be further provided. The portion (the fourth portion 21d) of the first conductive member 21 recited above is between the first connector EC1 and the first region 63a in the third direction (the Z-axis direction). The first connector EC1 is electrically connected to the portion (the fourth portion 21d) of the first conductive member 21 recited above. The portion (the sixth portion 22f) of the second conductive member 22 recited above is between the second connector EC2 and the second region 63b in the third direction (the Z-axis direction). The second connector EC2 is electrically connected to the portion (the sixth portion 22f) of the second conductive member 22 recited above.

By such a configuration, the fourth portion 21d is held stably by being clamped between the first region 63a and the first connector EC1 in the Z-axis direction. The sixth portion 22f is held stably by being clamped between the second region 63b and the second connector EC2 in the Z-axis direction. The first conductive member 21 and the second conductive member 22 are more stable; and the deformation and the like are suppressed further.

As shown in FIG. 16C, third to sixth connectors EC3 to EC6 may be further provided. The first portion 21a of the first conductive member 21 is between the third connector EC3 and the first insulating portion 61 in the Z-axis direction. The third connector EC3 is electrically connected to the first portion 21a. The second portion 21b of the first conductive member 21 is between the fourth connector EC4 and the second insulating portion 62 in the Z-axis direction. The fourth connector EC4 is electrically connected to the second portion 21b. The ninth portion 22i of the second conductive member 22 is between the fifth connector EC5 and the fifth insulating portion 65 in the Z-axis direction. The fifth connector EC5 is electrically connected to the fifth portion 22i. The seventh portion 22g of the second conductive member 22 is between the sixth connector EC6 and the fourth insulating portion 64 in the Z-axis direction. The sixth connector EC6 is electrically connected to the seventh portion 22g.

The third connector EC3, the first connector EC1, and the fourth connector EC4 correspond respectively to the first connection member 31, the second connection member 32, and the third connection member 33 described in reference to FIG. 15A.

The second connector EC2, the sixth connector EC6, and the fifth connector EC5 may have functions similar to those of the first connection member 31, the second connection member 32, and the third connection member 33 described in reference to FIG. 15A.

For example, the third connector EC3, the first connector EC1, the fourth connector EC4, the first magnetic layer 11, and the second magnetic layer 12 may be electrically connected to the controller 70. For example, the second connector EC2, the sixth connector EC6, the fifth connector EC5, the first magnetic layer 11, and the second magnetic layer 12 may be electrically connected to the controller 70.

The first insulating region 41 and the first counter insulating region 41c may be further provided in the magnetic memory device 121.

In the magnetic memory device 121, for example, the first insulating region 41 may have at least one of the first concentration higher than the concentration of the silanol group included in the first insulating portion 61, the second concentration higher than the concentration of the hydroxide group included in the first insulating portion 61, the third concentration higher than the concentration of the hydrocarbon group included in the first insulating portion 61, the fourth concentration higher than the concentration of the imide group included in the first insulating portion 61, the first porosity higher than the porosity of the first insulating portion 61, or the first density lower than the density of the first insulating portion 61.

In the magnetic memory device 121, for example, the first insulating region 41 may have at least one of the first concentration higher than the concentration of the silanol group included in the second insulating portion 62, the second concentration higher than the concentration of the hydroxide group included in the second insulating portion 62, the third concentration higher than the concentration of the hydrocarbon group included in the second insulating portion 62, the fourth concentration higher than the concentration of the imide group included in the second insulating portion 62, the first porosity higher than the porosity of the second insulating portion 62, or the first density lower than the density of the second insulating portion 62.

Figure 17:
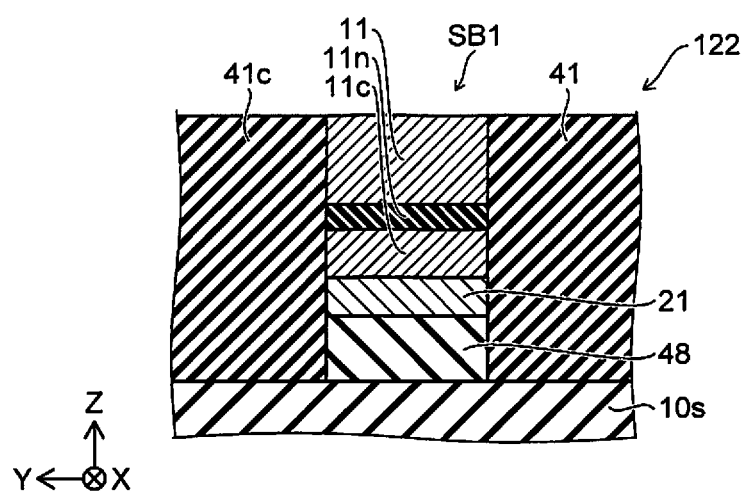
FIG. 17 is a schematic cross-sectional view illustrating a magnetic memory device according to the second embodiment.

FIG. 17 is a schematic cross-sectional view illustrating a magnetic memory device according to the second embodiment.

FIG. 17 is a cross-sectional view corresponding to FIG. 15B. In the magnetic memory device 122 according to the embodiment, the configurations of the first insulating region 41 and the first counter insulating region 41c are different from those of the magnetic memory device 120. Otherwise, the configuration of the magnetic memory device 122 may be similar to the configuration of the magnetic memory device 120.

In the magnetic memory device 122 as shown in FIG. 17, the position in the third direction (the Z-axis direction) of the first conductive member 21 is between the position in the third direction of a portion of the first insulating region 41 and the position in the third direction of another portion of the first insulating region 41. For example, the lower end of the first insulating region 41 is lower than the lower end of the first conductive member 21. For example, the upper end of the first insulating region 41 is higher than the upper end of the first conductive member 21.

The position in the third direction (the Z-axis direction) of the first conductive member 21 is between the position in the third direction of a portion of the first counter insulating region 41c and the position in the third direction of another portion of the first counter insulating region 41c. For example, the lower end of the first counter insulating region 41c is lower than the lower end of the first conductive member 21. For example, the upper end of the first counter insulating region 41c is higher than the upper end of the first conductive member 21.

By such a configuration, the local stress of the first conductive member 21 is relaxed easily.

In the magnetic memory devices according to the first embodiment and the second embodiment, it is favorable for the length (the thickness) along the Z-axis direction of the first magnetic element SB1 to be not more than 5 times the length (the thickness) along the Z-axis direction of the first conductive member 21. Because the first magnetic element SB1 is thin, the control of the stress of the first conductive member 21 is easy. For example, technology may be considered in which the magnetization of the first magnetic layer 11 is controlled by a magnetic portion of IrMn, etc., in the first magnetic element SB1. For example, the first magnetic element SB1 easily can be thin by omitting the magnetic portion, etc.

In the embodiments recited above, the magnetic layers (the first to fourth magnetic layers 11 to 14, the first to fourth counter magnetic layers 11c to 14c, etc.) are, for example, ferromagnetic. The magnetic layers include, for example, at least one selected from the group consisting of Fe, Co, and Ni. The nonmagnetic layers (the first to fourth nonmagnetic layers 11n to 14n, etc.) include, for example, at least one selected from the group consisting of MgO, CaO, SrO, TiO, VO, NbO, and $Al_2O_3$. The nonmagnetic layer may include, for example, at least one selected from the group consisting of Ga, Al, and Cu.

The conductive members (the first conductive member 21, the second conductive member 22, etc.) include, for example, at least one selected from the group consisting of Ta, W, Pt, and Au.

In the magnetic memory device, the effects on the neighboring elements due to the leakage magnetic field from the memory layer increase as downscaling advances due to the increase of the storage density; and a write error rate WER increases. In the magnetic memory device, it is important to realize both thermal agitation resistance and a higher recording density due to element downscaling. According to the embodiments, the write error rate WER can be low even when the element spacing is narrow. A magnetic memory device that has high thermal agitation resistance can be provided. The fluctuation of the magnetization reversal energy due to the leakage magnetic field from the proximal elements can be suppressed. The decrease of the thermal agitation resistance can be suppressed.

The embodiments may include the following configurations (e.g., technological proposals).

Configuration 1

A magnetic memory device, comprising:
a first insulating region;
a first counter insulating region;
a first conductive member provided between the first insulating region and the first counter insulating region, the first conductive member extending in a first direction crossing a second direction, the second direction being from the first insulating region toward the first counter insulating region; and
a first magnetic element provided between the first insulating region and the first counter insulating region, a third direction from the first conductive member toward the first magnetic element crossing a plane including the first direction and the second direction,
a portion of a first insulating side surface of the first insulating region opposing the first conductive member and being oblique to the first direction,
a portion of a first counter insulating side surface of the first counter insulating region opposing the first conductive member and being oblique to the first direction.

Configuration 2

The magnetic memory device according to Configuration 1, wherein
a plurality of the first magnetic elements is provided, and
a distance along the second direction between the first insulating side surface and the first counter insulating side surface repeats an increase and decrease corresponding to the plurality of first magnetic elements.

Configuration 3

The magnetic memory device according to Configuration 1, further comprising:
a second insulating region; and
a second counter insulating region,
the first conductive member including
a first portion,
a second portion, and
a third portion between the first portion and the second portion,
a direction from the first portion toward the second portion being aligned with the first direction,
the second insulating region and the second counter insulating region being between the first insulating region and the first counter insulating region in the second direction,
a direction from the first portion toward the second insulating region, a direction from the second portion toward the second counter insulating region, and a direction from the third portion toward the first magnetic element being aligned with the third direction,
a material of the first insulating region being different from a material of the second insulating region.

Configuration 4

The magnetic memory device according to Configuration 3, wherein
the first insulating region has at least one of
a first concentration higher than a concentration of a silanol group included in the second insulating region,
a second concentration higher than a concentration of a hydroxide group included in the second insulating region,
a third concentration higher than a concentration of a hydrocarbon group included in the second insulating region,
a fourth concentration higher than a concentration of an imide group included in the second insulating region,
a porosity higher than a porosity of the second insulating region, or
a density lower than a density of the second insulating region.

Configuration 5

A magnetic memory device, comprising:
a first conductive member extending along a first direction and including a first portion, a second portion, and a third portion between the first portion and the second portion, the first direction being from the first portion toward the second portion;
a first insulating region, a second direction from the first insulating region toward the first conductive member crossing the first direction;
a first magnetic element, a third direction from the third portion toward the first magnetic element crossing a plane including the first direction and the second direction; and
a second insulating region, a direction from the first portion toward the second insulating region being aligned with the third direction, a direction from the second insulating region toward the first magnetic element being aligned with the first direction,
the first insulating region having at least one of
a first concentration higher than a concentration of a silanol group included in the second insulating region,
a second concentration higher than a concentration of a hydroxide group included in the second insulating region,
a third concentration higher than a concentration of a hydrocarbon group included in the second insulating region,
a fourth concentration higher than a concentration of an imide group included in the second insulating region,
a porosity higher than a porosity of the second insulating region, or
a density lower than a density of the second insulating region.

Configuration 6

The magnetic memory device according to any one of Configurations 3 to 5, wherein
the first insulating region has a first side surface opposing the first magnetic element in the second direction,
the second insulating region has a second side surface opposing the first magnetic element in the first direction,
the first side surface is convex toward the first magnetic element in a first cross section including the second direction and the third direction, and
a curvature of the first side surface in the first cross section is higher than a curvature of the second side surface in a second cross section including the first direction and the third direction.

Configuration 7

The magnetic memory device according to any one of Configurations 1 to 6, further comprising a first member,
the first member including a first member region, a second member region, and a third member region between the first member region and the second member region,
a direction from the first member region toward the second member region being aligned with the second direction, a direction from the first member region toward the first insulating region and a direction from the third member region toward the first magnetic element being aligned with the third direction, the third member region having a side surface crossing the second direction, the first insulating region opposing at least a portion of the side surface in the second direction.

Configuration 8

A magnetic memory device, comprising:

a first conductive member extending along a first direction and including a first portion, a second portion, and a third portion between the first portion and the second portion, the first direction being from the first portion toward the second portion;

a first insulating region, a second direction from the first insulating region toward the first conductive member crossing the first direction;

a first magnetic element, a third direction from the third portion toward the first magnetic element crossing a plane including the first direction and the second direction; and a first member, the first member including a first member region, a second member region, and a third member region between the first member region and the second member region, a direction from the first member region toward the second member region being aligned with the second direction, a direction from the first member region toward the first insulating region and a direction from the third member region toward the first magnetic element being aligned with the third direction, the third member region having a side surface crossing the second direction, the first insulating region opposing at least a portion of the side surface in the second direction.

Configuration 9

The magnetic memory device according to Configuration 8, further comprising:

a second insulating region; and a second counter insulating region, a direction from the first portion toward the second insulating region, a direction from the second portion toward the second counter insulating region, and a direction from the third portion toward the first magnetic element being aligned with the third direction, the first insulating region having a first side surface opposing the first magnetic element in the second direction, the second insulating region having a second side surface opposing the first magnetic element in the first direction, the first side surface being convex toward the first magnetic element in a first cross section including the second direction and the third direction, a curvature of the first side surface in the first cross section being higher than a curvature of the second side surface in a second cross section including the first direction and the third direction.

Configuration 10

A magnetic memory device, comprising:

a first conductive member extending along a first direction and including a first portion, a second portion, and a third portion between the first portion and the second portion, the first direction being from the first portion toward the second portion;

a first insulating region, a second direction from the first insulating region toward the first conductive member crossing the first direction;

a first magnetic element, a third direction from the third portion toward the first magnetic element crossing a plane including the first direction and the second direction; and a second insulating region, a direction from the first portion toward the second insulating region being aligned with the third direction, a direction from the second insulating region toward the first magnetic element being aligned with the first direction, the first insulating region having a first side surface opposing the first magnetic element in the second direction, the second insulating region having a second side surface opposing the first magnetic element in the first direction, the first side surface being convex toward the first magnetic element in a first cross section including the second direction and the third direction, a curvature of the first side surface in the first cross section being higher than a curvature of the second side surface in a second cross section including the first direction and the third direction.

Configuration 11

A magnetic memory device, comprising:

a first conductive member including a first portion, a second portion, and a third portion between the first portion and the second portion, the first conductive member being aligned with a direction, the first direction being from the first portion toward the second portion;

a first insulating region, a second direction from the first insulating region toward the first conductive member crossing the first direction;

a second insulating region, a direction from the second insulating region toward the first conductive member being aligned with the first direction, a material of the first insulating region being different from a material of the second insulating region; and a first magnetic element, a third direction from the third portion toward the first magnetic element crossing a plane including the first direction and the second direction.

Configuration 12

The magnetic memory device according to Configuration 11, wherein the first insulating region has at least one of a first concentration higher than a concentration of a silanol group included in the second insulating region, a second concentration higher than a concentration of a hydroxide group included in the second insulating region, a third concentration higher than a concentration of a hydrocarbon group included in the second insulating region, a fourth concentration higher than a concentration of an imide group included in the second insulating region, a porosity higher than a porosity of the second insulating region, or a density lower than a density of the second insulating region.

Configuration 13

The magnetic memory device according to Configuration 11 or 12, wherein the first insulating region has a first side surface opposing the first magnetic element in the second direction, the second insulating region has a second side surface opposing the first magnetic element in the first direction, the first side surface is convex toward the first magnetic element in a first cross section including the second direction and the third direction, and a curvature of the first side surface in the first cross section is higher than a curvature of the second side surface in a second cross section including the first direction and the third direction.

Configuration 14

The magnetic memory device according to any one of Configurations 11 to 13, further comprising a first member, the first member including a first member region, a second member region, and a third member region between the first member region and the second member region, a direction from the first member region toward the second member region being aligned with the second direction, a direction from the first member region toward the first insulating region and a direction from the third member region toward the first magnetic element being aligned with the third direction, the third member region having a side surface crossing the second direction, the first insulating region opposing at least a portion of the side surface in the second direction.

Configuration 15

The magnetic memory device according to any one of Configurations 1 to 14, wherein the first magnetic element includes:

a first magnetic layer;

a first counter magnetic layer provided between the first conductive member and the first magnetic layer in the third direction; and a first nonmagnetic layer provided between the first magnetic layer and the first counter magnetic layer.

Configuration 16

The magnetic memory device according to any one of Configurations 1 to 15, wherein a lattice length along the first direction of the first conductive member is different from a lattice length along the second direction of the first conductive member.

Configuration 17

A magnetic memory device, comprising:

a first insulating portion;

a second insulating portion;

a third insulating portion, the second insulating portion being between the first insulating portion and the third insulating portion in a first direction, the first direction being from the first insulating portion toward the third insulating portion;

a first conductive member provided between at least a portion of the first insulating portion and at least a portion of the third insulating portion;

a first magnetic element provided between the first insulating portion and the second insulating portion, a direction from the first conductive member toward the first magnetic element being aligned with a third direction crossing the first direction; and a second magnetic element provided between the second insulating portion and the third insulating portion, a direction from the first conductive member toward the second magnetic element being aligned with the third direction, a material of the first insulating portion being different from a material of the second insulating portion.

Configuration 18

The magnetic memory device according to Configuration 17, further comprising:

a first insulating region; and a first counter insulating region, the first magnetic element and the second magnetic element being provided between the first insulating region and the first counter insulating region in a second direction, the second direction being from the first insulating region toward the first counter insulating region, the material of the first insulating portion being different from a material of the first insulating region.

Configuration 19

The magnetic memory device according to Configuration 18, wherein the first insulating region has at least one of a first concentration higher than a concentration of a silanol group included in the first insulating portion, a second concentration higher than a concentration of a hydroxide group included in the first insulating portion, a third concentration higher than a concentration of a hydrocarbon group included in the first insulating portion, a fourth concentration higher than a concentration of an imide group included in the first insulating portion, a porosity higher than a porosity of the first insulating portion, or a density lower than a density of the first insulating portion.

Configuration 20

The magnetic memory device according to Configuration 17, further comprising;

a first insulating region; and a first counter insulating region, the first magnetic element and the second magnetic element being provided between the first insulating region and the first counter insulating region in a second direction, the second direction being from the first insulating region toward the first counter insulating region, the material of the second insulating portion being different from a material of the first insulating region.

Configuration 21

The magnetic memory device according to Configuration 20, wherein the first insulating region has at least one of a first concentration higher than a concentration of a silanol group included in the second insulating portion, a second concentration higher than a concentration of a hydroxide group included in the second insulating portion, a third concentration higher than a concentration of a hydrocarbon group included in the second insulating portion, a fourth concentration higher than a concentration of an imide group included in the second insulating portion, a porosity higher than a porosity of the second insulating portion, or a density lower than a density of the second insulating portion.

Configuration 22

The magnetic memory device according to any one of Configurations 17 to 21, wherein a position in the third direction of the first conductive member is between a position in the third direction of a portion of the first insulating region and a position in the third direction of an other portion of the first insulating region.

Configuration 23

The magnetic memory device according to any one of Configurations 17 to 22, further comprising:

a fourth insulating portion;

a fifth insulating portion, the fourth insulating portion being between the third insulating portion and the fifth insulating portion in the first direction;

a second conductive member provided between at least a portion of the third insulating portion and at least a portion of the fifth insulating portion;

a third magnetic element provided between the third insulating portion and the fourth insulating portion, a direction from the second conductive member toward the third magnetic element being aligned with the third direction; and a fourth magnetic element provided between the fourth insulating portion and the fifth insulating portion, a direction from the second conductive member toward the fourth magnetic element being aligned with the third direction, a direction from a portion of the first conductive member toward a first region of the third insulating portion being aligned with the third direction, a direction from a portion of the second conductive member toward a second region of the third insulating portion being aligned with the third direction, a third region of the third insulating portion being between the first conductive member and the second conductive member in the first direction.

Configuration 24

The magnetic memory device according to Configuration 23, further comprising a first connector and a second connector, the portion of the first conductive member being between the first connector and the first region in the third direction, the first connector being electrically connected to the portion of the first conductive member, the portion of the second conductive member being between the second connector and the second region in the third direction, the second connector being electrically connected to the portion of the second conductive member.

Configuration 25

The magnetic memory device according to any one of Configurations 1 to 24, further comprising an insulating layer, a direction from the insulating layer toward the first magnetic element being aligned with the third direction, the insulating layer including a first element and a second element, the first element being at least one selected from the group consisting of Al, Si, Ti, Ta, Hf, Mg, B, Sc, Li, and Cr, the second element being at least one selected from the group consisting of oxygen and nitrogen.

According to the embodiments, a magnetic memory device can be provided in which the storage density can be increased.

In this specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between the multiple conductive bodies. The "state of being electrically connected" includes the state in which an electrical element (a switch element such as a transistor or the like) is inserted between multiple conductive bodies, and a state is formable in which a current flows between the multiple conductive bodies.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in magnetic memory devices such as metal including layers, magnetic layers, intermediate layers, insulating regions, insulating portions, base layers, controllers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all magnetic memory devices practicable by an appropriate design modification by one skilled in the art based on the magnetic memory devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory device, comprising:
a first insulating region;
a first counter insulating region;
a first conductive member provided between the first insulating region and the first counter insulating region, the first conductive member extending in a first direction crossing a second direction, the second direction being from the first insulating region toward the first counter insulating region; and
a first magnetic element provided between the first insulating region and the first counter insulating region, a third direction from the first conductive member toward the first magnetic element crossing a plane including the first direction and the second direction,
a portion of a first insulating side surface of the first insulating region opposing the first conductive member and being oblique to the first direction,
a portion of a first counter insulating side surface of the first counter insulating region opposing the first conductive member and being oblique to the first direction.

2. The device according to claim 1, wherein
a plurality of the first magnetic elements is provided, and
a distance along the second direction between the first insulating side surface and the first counter insulating side surface repeats an increase and decrease corresponding to the plurality of first magnetic elements.

3. The device according to claim 1, further comprising:
a second insulating region; and
a second counter insulating region,
the first conductive member including
a first portion,
a second portion, and
a third portion between the first portion and the second portion, a direction from the first portion toward the second portion being aligned with the first direction,
the second insulating region and the second counter insulating region being between the first insulating region and the first counter insulating region in the second direction,
a direction from the first portion toward the second insulating region, a direction from the second portion toward the second counter insulating region, and a direction from the third portion toward the first magnetic element being aligned with the third direction,
a material of the first insulating region being different from a material of the second insulating region.

4. The device according to claim 3, wherein
the first insulating region has at least one of
a first concentration higher than a concentration of a silanol group included in the second insulating region,
a second concentration higher than a concentration of a hydroxide group included in the second insulating region,
a third concentration higher than a concentration of a hydrocarbon group included in the second insulating region,
a fourth concentration higher than a concentration of an imide group included in the second insulating region,
a porosity higher than a porosity of the second insulating region, or
a density lower than a density of the second insulating region.

5. The device according to claim 3, wherein
the first insulating region has a first side surface opposing the first magnetic element in the second direction,
the second insulating region has a second side surface opposing the first magnetic element in the first direction,
the first side surface is convex toward the first magnetic element in a first cross section including the second direction and the third direction, and
a curvature of the first side surface in the first cross section is higher than a curvature of the second side surface in a second cross section including the first direction and the third direction.

6. The device according to claim 1, further comprising a first member,
the first member including a first member region, a second member region, and a third member region between the first member region and the second member region,
a direction from the first member region toward the second member region being aligned with the second direction,
a direction from the first member region toward the first insulating region and a direction from the third member region toward the first magnetic element being aligned with the third direction,
the third member region having a side surface crossing the second direction,
the first insulating region opposing at least a portion of the side surface in the second direction.

7. A magnetic memory device, comprising:
a first conductive member including a first portion, a second portion, and a third portion between the first portion and the second portion, the first conductive member being aligned with a first direction, the direction being from the first portion toward the second portion;
a first insulating region, a second direction from the first insulating region toward the first conductive member crossing the first direction,
a second insulating region, a direction from the second insulating region toward the first conductive member being aligned with the first direction, a material of the first insulating region being different from a material of the second insulating region; and
a first magnetic element, a third direction from the third portion toward the first magnetic element crossing a plane including the first direction and the second direction.

8. The device according to claim 7, wherein
the first insulating region has at least one of
a first concentration higher than a concentration of a silanol group included in the second insulating region,
a second concentration higher than a concentration of a hydroxide group included in the second insulating region,
a third concentration higher than a concentration of a hydrocarbon group included in the second insulating region,
a fourth concentration higher than a concentration of an imide group included in the second insulating region,
a porosity higher than a porosity of the second insulating region, or
a density lower than a density of the second insulating region.

9. The device according to claim 7, wherein
the first insulating region has a first side surface opposing the first magnetic element in the second direction,
the second insulating region has a second side surface opposing the first magnetic element in the first direction,
the first side surface is convex toward the first magnetic element in a first cross section including the second direction and the third direction, and
a curvature of the first side surface in the first cross section is higher than a curvature of the second side surface in a second cross section including the first direction and the third direction.

10. The device according to claim 7, further comprising a first member,
the first member including a first member region, a second member region, and a third member region between the first member region and the second member region,
a direction from the first member region toward the second member region being aligned with the second direction,
a direction from the first member region toward the first insulating region and a direction from the third member region toward the first magnetic element being aligned with the third direction,
the third member region having a side surface crossing the second direction,
the first insulating region opposing at least a portion of the side surface in the second direction.

11. The device according to claim 1, wherein
the first magnetic element includes:
a first magnetic layer;
a first counter magnetic layer provided between the first conductive member and the first magnetic layer in the third direction; and
a first nonmagnetic layer provided between the first magnetic layer and the first counter magnetic layer.

12. A magnetic memory device, comprising:
a first insulating portion;
a second insulating portion;
a third insulating portion, the second insulating portion being between the first insulating portion and the third insulating portion in a first direction, the first direction being from the first insulating portion toward the third insulating portion;
a first conductive member provided between at least a portion of the first insulating portion and at least a portion of the third insulating portion;
a first magnetic element provided between the first insulating portion and the second insulating portion, a direction from the first conductive member toward the first magnetic element being aligned with a third direction crossing the first direction; and
a second magnetic element provided between the second insulating portion and the third insulating portion, a direction from the first conductive member toward the second magnetic element being aligned with the third direction,
a material of the first insulating portion being different from a material of the second insulating portion.

13. The magnetic memory device according to claim 12, further comprising:
a first insulating region; and
a first counter insulating region,
the first magnetic element and the second magnetic element being provided between the first insulating region and the first counter insulating region in a second direction, the second direction being from the first insulating region toward the first counter insulating region,
the material of the first insulating portion being different from a material of the first insulating region.

14. The magnetic memory device according to claim 13, wherein
the first insulating region has at least one of
a first concentration higher than a concentration of a silanol group included in the first insulating portion,
a second concentration higher than a concentration of a hydroxide group included in the first insulating portion,
a third concentration higher than a concentration of a hydrocarbon group included in the first insulating portion,
a fourth concentration higher than a concentration of an imide group included in the first insulating portion,
a porosity higher than a porosity of the first insulating portion, or
a density lower than a density of the first insulating portion.

15. The magnetic memory device according to claim 12, further comprising:
a first insulating region; and
a first counter insulating region,
the first magnetic element and the second magnetic element being provided between the first insulating region and the first counter insulating region in a second direction, the second direction being from the first insulating region toward the first counter insulating region,
the material of the second insulating portion being different from a material of the first insulating region.

16. The magnetic memory device according to claim 15, wherein
the first insulating region has at least one of
a first concentration higher than a concentration of a silanol group included in the second insulating portion,
a second concentration higher than a concentration of a hydroxide group included in the second insulating portion,
a third concentration higher than a concentration of a hydrocarbon group included in the second insulating portion,
a fourth concentration higher than a concentration of an imide group included in the second insulating portion,
a porosity higher than a porosity of the second insulating portion, or
a density lower than a density of the second insulating portion.

17. The magnetic memory device according to claim 12, wherein a position in the third direction of the first conductive member is between a position in the third direction of a portion of the first insulating region and a position in the third direction of an other portion of the first insulating region.

18. The magnetic memory device according to claim 12, further comprising:
a fourth insulating portion;
a fifth insulating portion, the fourth insulating portion being between the third insulating portion and the fifth insulating portion in the first direction;
a second conductive member provided between at least a portion of the third insulating portion and at least a portion of the fifth insulating portion;
a third magnetic element provided between the third insulating portion and the fourth insulating portion, a direction from the second conductive member toward the third magnetic element being aligned with the third direction; and
a fourth magnetic element provided between the fourth insulating portion and the fifth insulating portion, a direction from the second conductive member toward the fourth magnetic element being aligned with the third direction,
a direction from a portion of the first conductive member toward a first region of the third insulating portion being aligned with the third direction,
a direction from a portion of the second conductive member toward a second region of the third insulating portion being aligned with the third direction,
a third region of the third insulating portion being between the first conductive member and the second conductive member in the first direction.

19. The magnetic memory device according to claim 18, further comprising a first connector and a second connector,
the portion of the first conductive member being between the first connector and the first region in the third direction,
the first connector being electrically connected to the portion of the first conductive member,
the portion of the second conductive member being between the second connector and the second region in the third direction,
the second connector being electrically connected to the portion of the second conductive member.

20. The magnetic memory device according to claim 12, further comprising an insulating layer,
a direction from the insulating layer toward the first magnetic element being aligned with the third direction, the insulating layer including a first element and a second element, the first element being at least one selected from the group consisting of Al, Si, Ti, Ta, Hf, Mg, B, Sc, Li, and Cr, the second element being at least one selected from the group consisting of oxygen and nitrogen.

* * * * *